(12) United States Patent
Aipperspach et al.

(10) Patent No.: US 6,247,166 B1
(45) Date of Patent: *Jun. 12, 2001

(54) METHOD AND APPARATUS FOR ASSEMBLING ARRAY AND DATAPATH MACROS

(75) Inventors: Anthony Gus Aipperspach; Peter Thomas Freiburger, both of Rochester, MN (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/104,621

(22) Filed: Jun. 25, 1998

(51) Int. Cl.[7] .................................................. G06F 17/50
(52) U.S. Cl. .................. 716/8; 716/1; 716/121; 716/1.3; 716/21
(58) Field of Search .............................................. 716/8, 1

(56) References Cited

U.S. PATENT DOCUMENTS

| | | |
|---|---|---|
| 4,849,904 | 7/1989 | Aipperspach et al. . |
| 4,910,574 | 3/1990 | Aipperspach et al. . |
| 5,068,603 * | 11/1991 | Mahoney ............................ 324/158 |
| 5,206,815 * | 4/1993 | Purcell ................................ 364/491 |
| 5,262,959 * | 11/1993 | Chkoreff ............................. 364/489 |
| 5,378,904 * | 1/1995 | Suzuki et al. ....................... 257/208 |
| 5,416,721 * | 5/1995 | Nishiyama et al. ................. 364/491 |
| 5,446,675 * | 8/1995 | Yoshimura .......................... 364/489 |
| 5,513,119 * | 4/1996 | Moore et al. ........................ 364/491 |
| 5,666,289 * | 9/1997 | Watkins .............................. 364/491 |
| 5,987,086 * | 11/1999 | Raman et al. ................... 375/500.02 |

* cited by examiner

Primary Examiner—Matthew Smith
Assistant Examiner—A. M. Thompson
(74) Attorney, Agent, or Firm—Joan Pennington

(57) ABSTRACT

A method, computer program product and apparatus for assembling array and datapath macros are provided for very large scale integrated (VLSI) semiconductor integrated circuits. User selections are received for a hierarchical macro to be created. The user selections include a command list of multiple leaf cell build commands. X and Y placer pointers are initialized. A next build command is obtained from the command list and a command type is identified. Responsive to identifying a next leaf cell build command in a leaf cell group, a user selected schematic or physical view is identified. A corresponding leaf cell view is read for the user selected schematic or physical view. X and Y sizes are obtained for the leaf cell view. Then the leaf cell is oriented and placed. Next X and Y placer pointers are calculated and the sequential steps are repeated until a last leaf cell build command in the leaf cell group is found. Then the sequential steps return to obtain a next build command from the command list. Connections to adjacent leaf cells are provided by abutting cells together. Port and pin connections from the periphery of the array of placed leaf cells are propagated to a next hierarchical level of the hierarchical macro being created.

21 Claims, 29 Drawing Sheets

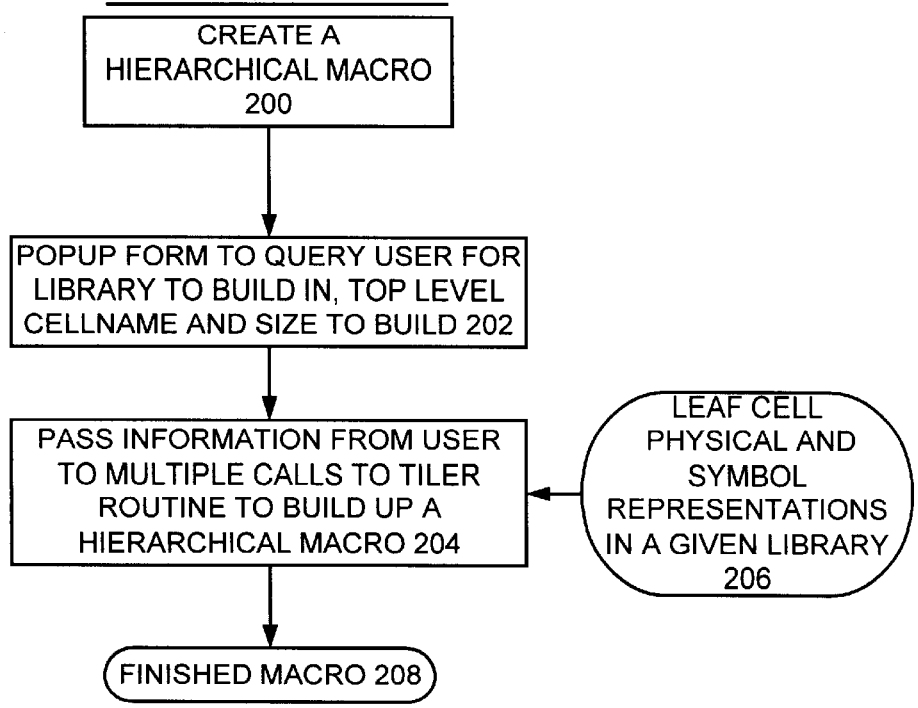
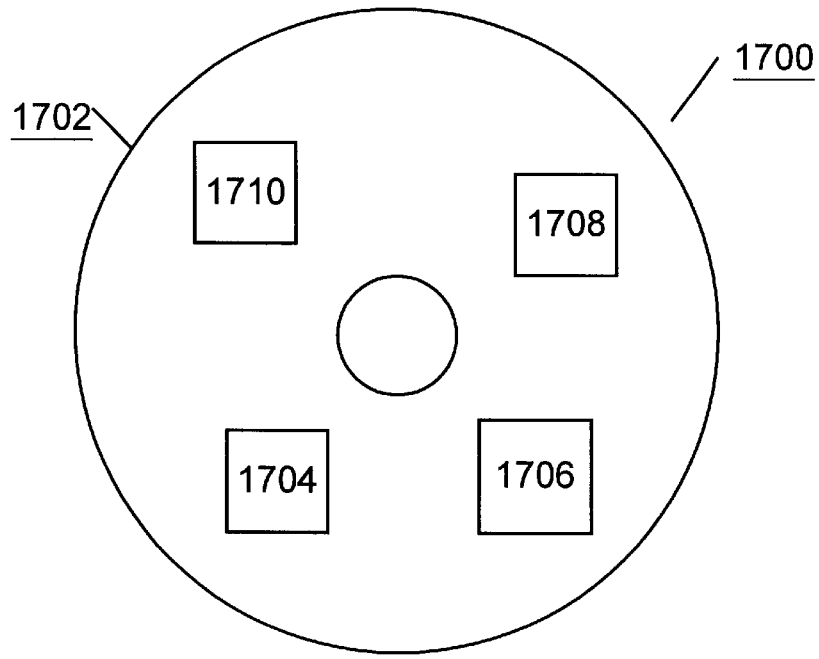

FLAT TILE PHYSICAL

LEVEL_0 PHYSICAL demo1 demo2 demo3 at C - FIGURES 3A & 3E demo3 at I - FIGURES 3F & 3G

METHOD AND APPARATUS FOR ASSEMBLING ARRAY AND DATAPATH MACROS

FIELD OF THE INVENTION

The present invention relates to a method and apparatus for assembling array and datapath macros for very large scale integrated (VLSI) semiconductor integrated circuits.

DESCRIPTION OF THE RELATED ART

VLSI devices are typically formed as circuit chips having a chip image including multiple logic and memory circuits integrally formed on a single semiconductor substrate. The VLSI devices may be formed, for example, by a field effect transistor (FET) technique with conventional complementary metal oxide semiconductor (CMOS) technology. Advancement in VLSI technology allows system architects to pack more and more functions into a chip.

Predesigned functional macros or leaf cells may include many different integrated circuits of varying complexity. Leaf cells are comprised of hand generated schematics, symbols, and physicals or layouts. As used in the following description and claims, physicals and layouts are equivalent terms. For example leaf cells include simple inverter circuits, multiplexor (MUX) circuits, and empty pad or spacing circuits. Custom arrays are typically designed individually and may include thousands of leaf cells. This design approach creates serious problems in the layout and design of the overall chip image because the conventional design approach does not effectively facilitate placement and wiring of multiple leaf cells on the chip to provide a desired system.

Assembly of array and datapath macros is a tedious and error prone procedure, especially when attributes and/or properties for Layout Versus Schematic (LVS) are required. These macros typically have thousands of leaf cells that need to be assembled. Standard assembly procedures such a Place and Route programs are too random and complicated for the structured assembly required for some problems, such as memory array and datapath macros. Known array generation or grow programs are too constrained and rigid for general application.

SUMMARY OF THE INVENTION

A principal object of the present invention is to provide an improved method and apparatus for assembling array and datapath macros for very large scale integrated (VLSI) semiconductor integrated circuits. Other important objects of the present invention are to provide such method and apparatus for assembling array and datapath macros for very large scale integrated (VLSI) semiconductor integrated circuits substantially without negative effects and that overcome some disadvantages of prior art arrangements.

In brief, a method, computer program product and apparatus for assembling array and datapath macros are provided for very large scale integrated (VLSI) semiconductor integrated circuits. User selections are received for a hierarchical macro to be created. The user selections include a command list of multiple leaf cell build commands. X and Y placer pointers are initialized. A next build command is obtained from the command list and a command type is identified. Responsive to identifying a next leaf cell build command in a leaf cell group, a user selected schematic or physical view is identified. A corresponding leaf cell view is read for the user selected schematic or physical view. X and Y sizes are obtained for the leaf cell view. Then the leaf cell is oriented and placed. Next X and Y placer pointers are calculated and the sequential steps are repeated until a last leaf cell build command in the leaf cell group is found. Then the sequential steps return to obtain a next build command from the command list.

Connections to adjacent leaf cells are provided by abutting cells together. Port and pin connections from the periphery of the array of placed leaf cells are propagated to a next hierarchical level of the hierarchical macro being created.

BRIEF DESCRIPTION OF THE DRAWINGS

The present invention together with the above and other objects and advantages may best be understood from the following detailed description of the preferred embodiments of the invention illustrated in the drawings, wherein:

FIGS. 2, 3A, 3B, 3C, 3D, 3E, 3F, and 3G are flow charts illustrating exemplary sequential steps for creating a hierarchical macro in accordance with the preferred embodiment;

FIG. 17 is a block diagram illustrating a computer program product in accordance with the preferred embodiment.

DETAILED DESCRIPTION OF THE PREFERRED EMBODIMENT

Figure 1:
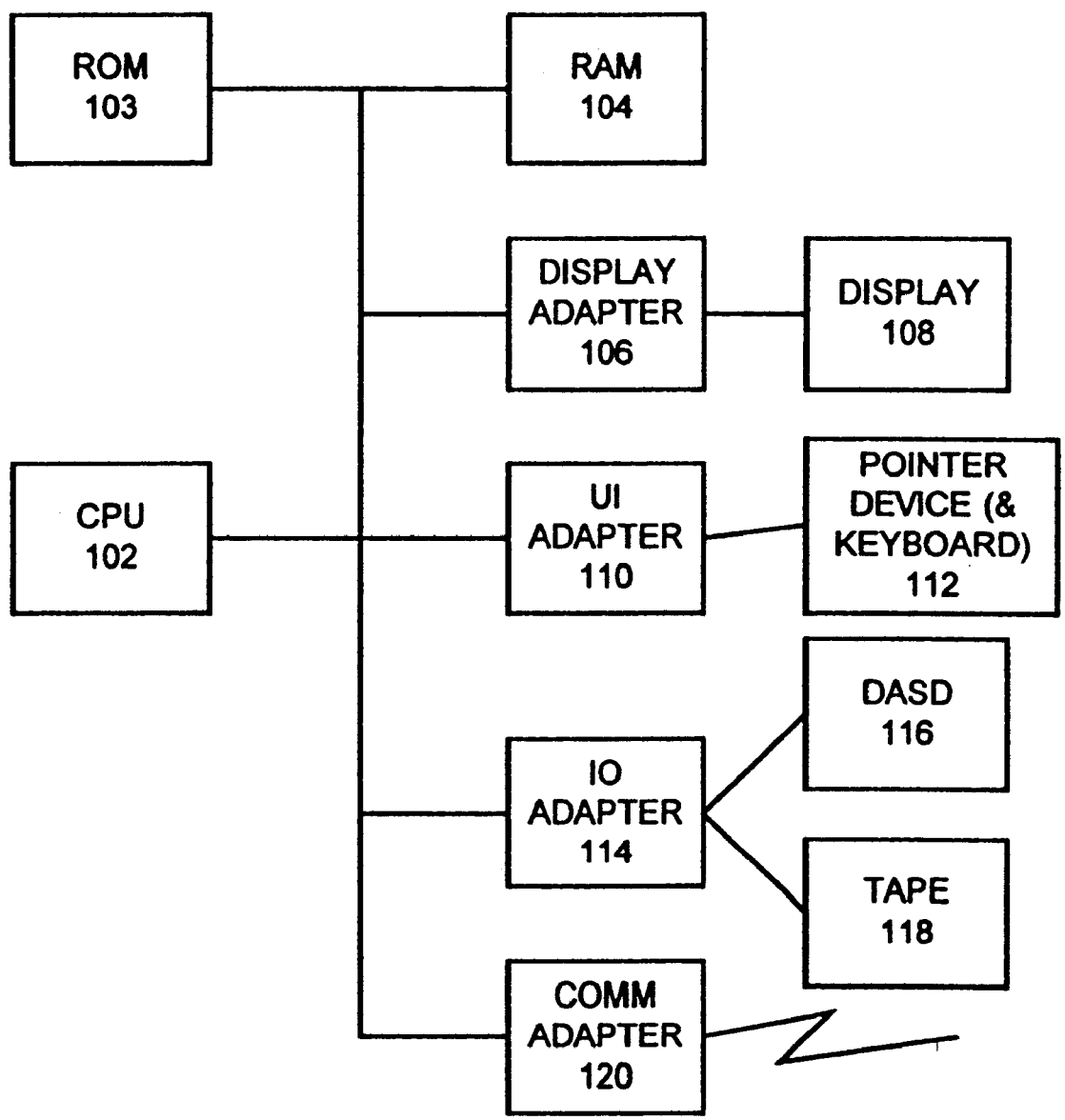
FIG. 1 is a block diagram representation illustrating a computer system for implementing methods for creating a hierarchical macro in accordance with the preferred embodiment.

Having reference now to the drawings, in FIG. 1, there is shown a computer or data processing system of the preferred embodiment generally designated by the reference character 100. As shown in FIG. 1, computer system 100 includes a central processor unit (CPU) 102, a read only memory 103, a random access memory or main memory 104, and a display adapter 106 coupled to a display 108. CPU 102 is connected to a user interface (UI) adapter 110 connected to a pointer device and keyboard 112. CPU 102 is connected to an input/output (IO) adapter 114 connected to a direct access storage device (DASD) 116 and a tape unit 118. CPU 102 is connected to a communications adapter 120 providing a communications function.

Various commercially available processors could be used for computer system 100, for example, an IBM personal computer or similar workstation can be used. An example of a specific computer system on which the invention may be implemented is the International Business Machines Corp.

RS/6000 computer system. Central processor unit(s) 102 is suitably programmed to execute the flowcharts of FIGS. 2, 3A, 3B, 3C, 3D, 3E, 3F, and 3G for creating a hierarchical macro and for assembling array and datapath macros for very large scale integrated (VLSI) semiconductor integrated circuits in accordance with the preferred embodiment.

In accordance with features of the preferred embodiment, a hierarchical tiler (buildArray) is provided for assembling leaf cells in such a way so as to create bigger leaf cells for the next level of assembly. Leaf cells are tiled together with connections to adjacent cells being made by abutting cells together. Schematic and layout are specified by the same code. Ports and pins from the periphery of the matrix of leaf cells placed are propagated to the next level of the hierarchy in a manner compatible with conventional Layout Versus Schematic (LVS) processes. Tiler routines of the preferred embodiment are used to create a user selected architecture of the macro. A user enters selections or writes a configuration file for the class of macros to be tiled. The tiler routines illustrated and described with respect to FIGS. 2, 3A, 3B, 3C, 3D, 3E, 3F, and 3G, support the creation of schematics, layouts and symbols. All necessary properties and attributes for LVS checking are automatically added to the cell or hierarchical macro to be created. The tiler routine supports adding power and ground busing, and has provisions for altering pin/port placement.

Referring to FIG. 2, there are shown sequential steps for hierarchical tiler usage to create a hierarchical macro as indicated at a block 200. A popup form or menu is provided to query the user for a predefined library to build in, a top level cellname, and a cell or macro size to build as indicated at a block 202. Information from the user selections are passed to multiple calls to the tiler routine to build a hierarchical macro of the preferred embodiment as indicated at a block 204. Physical, schematic, and symbol representations of a leaf cell from the given library are passed to the tiler routine as indicated at a block 206. A finished macro is created as indicated at a block 208.

Referring to now FIGS. 3A, 3B, 3C, 3D, 3E, 3F, and 3G, exemplary sequential steps for creating a hierarchical macro in accordance with the preferred embodiment are shown starting at a block 300. As indicated at a block 302, a call to the buildArray routine of the preferred embodiment is made to pass a library name, a cell name, a view type, an edge to build from, a list of leaf cell build commands, and build directives as indicated at a block 302. Referring also to TABLE 1: BUILDARRAY below, arguments for the buildArray tiler routine are defined. As illustrated in TABLE 1, the buildArray hierarchical macro generator or grow tiler was written in the Cadence SKILL language. It should be understood that other languages could be used to implement methods of the preferred embodiment.

As illustrated in TABLE 1, build directives are used to override default values or behavior. The following TABLE 1 is included to show the necessary functionality required to solve the generalized problem of implementing a hierarchical tiler. Given a set of correctly composed leaf cells the invention will yield identically constructed physical and schematic views. Directives either apply to the building of schematic or physical views or to both.

Some directives are needed to solve the generalized problem of tiling non-uniform cell sizes with local, bussed and global pin structures and creating a valid leaf cell for the next level of hierarchy.

Additional directives are specialized for building the physical so LVS can run cleanly or so the macro will conform to a given set of chip requirements.

The hierarchical tiler creates a new cell in library t_libName, named t_cellName of view type, t_viewName as specified by the t_edgeToBuildFrom and l_Specification. The methodology is the same for all view types. Leaf cells are "tiled" together to create an array of cells, with connectively to adjacent cells by abutment. Pins or ports that end up on the edge of the array are propagated up to the next level. Cells built with the hierarchical tiler meet the requirements for leaf cells at the next level.

All leaf cells must have symbols and physicals. The physical needs to have a rectangular box on level GROW-BOX that defines the boundary that will abut to adjacent cells. Symbols also have a bounding box and have pins aligned to the bounding box that connect to adjacent cells by abutment.

Table 1: Build Array buildArray(
    t_libName
    t_cellName
    t_viewName
    t_edgeToBuildFrom
    l_Specification
    [?am 4 lt_topm4opt]
    [?apt l_portNames]
    [?bx n_bump]
    [?by n_bump]
    [?do l_boxCoords]
    [?fps l_pinAndSides2]
    [?in l_pinNames]
    [?io l_pinNames]
    [?mg l_pinNames]
    [?note l_noteSpec]
    [?nps t_sides]
    [?out l_pinNames]
    [?pm l_mapList]
    [?pvg t_powerEdges]
    [?sb l_busSignals]
    [?sp l_pinNames]
)
→l_boxCoords The arguments of the build array macro are defined as follows:

t_libName specifies the Cadence library name for the new cell. Any cell referenced must also come from this library.

t_cellName specifies the name of the cell to be created.

t_viewName specifies the type of view to be created. Currently only "physical" and "schematic" are allowed.

t_edgeToBuildFrom specifies the first letter of the edge from which new cell will be built. The edge can be any of "t", "b", "l" or "r", where "t" specifies top, "b" specifies bottom, "l" specifies left and "r" specifies right. When set to "b" than the second group of cells will be placed above the first group placed (being built from the bottom).

l_Specification specifies the number of rows and columns for a set of leaf cells, followed by the cell name and an optional orientation. The list should have the following format where each line is a "group" referenced above:

list(x_rows x_cols t_lCellName [t_orient][x_rows
        x_cols t_lCellName [t_orient]][x_dirReset][x_rows
        x_cols t_lCellName [t_orient]]. . . )

x_rows specifies the number of rows of cell t_lCellName to place. Rows run horizontally.

x_cols specifies the number of columns of cell t_lCellName to place. Columns run vertically.

t_lCellName specifies the name of the leaf cell to be placed.

t_orient specifies an orientation for a leaf cell. The orientation is one of the Cadence orientations ("R0" "R90" "R180" "R270" "MX" "MY" "MXR90" "MYR90") or one of "YD" "XD" "XY". The orientation "YD" flips every other cell in a column about its X axis. The orientation "XD" flips every other cell in a row about its Y axis. And the orientation "XY" does both, to give four orientations. If no orientation is given the default is "R0".

x_dirReset is a negative integer that will reset the placer based on the value of t_edgeToBuildFrom. If t_edgeToBuildFrom is "b" than the placer will start placing the next set of cells from the bottom to the right of all the previous placements. If t_edgeToBuildFrom is "l" than the placer will start placing the next group of cells from the left above all the previous placements. Currently it can be any value less than zero.

l_portNames is a list of ports to have text added to the physical in the cell being grown. Any existing text on specified ports is discarded. This puts text on metal levels of metal one or above. Text will be placed over the first port shape encountered in the cell. To add text to all ports replace the list with a double quoted asterisk "*".

lt_topm4opt is either a list or string specifying how to place top level metalization and to put in top level macro elements for use by the place and route tools. The allowable options are:

nil is a default value, does nothing.

t adds metal four metalization power and ground buses and adds vias to connect to metal three metalization rectangles. Snaps "CLK" and "clk" pins from M3PIN or M3PST to a 2×2 pin on level M4PIN. This rounds the size to fit a predefined 10 channel by 1 channel grid and adds the OUTLINE box and OUT_TEXT shapes as required.

list(a b c) is a list of floats denoting how to place the power bussing and vias. "a" is the offset from where the M4 bus would normally start (−0.45). "b" is the point at which power vias should start being added. "c" is the point at which power vias should stop being added. If any part of the bus is blocked by "b" or "c" then no vias are placed on that bus.

"nv" is the same as "t", except vias between power and ground M4 and M3 are omitted.

float is a floating point number indicating how much to offset the M4 grid from the default value. Omits snapping "CLK" and "clk" pins, rounding size and adding OUTLINE and OUT_TEXT shapes.

t_pinName is a name of pin.

n_bump specifies how much the new symbol should be grown in the direction specified. The new symbols top or right side is stretched by n_bump times 0.125. n_bump can be positive or negative.

l_boxCorrds is a list specifying alternative "GROWBOX" coordinates for the physical view. The first pair is optional and designates the corner by the first cell placed. The second pair is the corner by the last cell placed. These are absolute coordinates, not offsets. The list should have the following form:

list([f_phyXcd f_phyYcd] f_phyXcd f_phyYcd)
f_phyXcd: Physical X-axis coordinate in microns.
f_phyYcd: Physical Y-axis coordinate in microns.

l_pinNames is a list of pin names. Has the following format:

list(t_pinName [t_pinName] . . . )

l_noteSpec is a list of specifications for a note on the new cells symbol. It has the following format:

list(t_nTxt [f_xCd [f_yCd [t_orient2 [f_height]]]])

t_nTxt is text of the note to be placed. May use "\n" to get more than one line.

f_xCd is the X-axis coordinate. Defaults to 0.375. (typically small, like 0.625)

f_yCd is the Y-axis coordinate. Defaults to 0.375. (typically small, like 0.875)

t_orient2 specifies an orientation for the text. The orientation must be one of the Cadence orientations ("R0" "R90" "R180" "R270" "MX" "MY" "MXR90" "MYR90").

f_height specifies the height for the text. Defaults to 0.0625.

l_mapList is a list containing pairs of pin names to be mapped. List should be in the following form:

list(t_pinName t_newName [x_sides][t_pinName t_newName [x_sides]] . . . )

Alternatively, all pins can be mapped to upper or lower case by the following formats respectively:

list("upper*") or list("lower*")

t_newName is a new name for the pin. Same format as t_PinName.

t_powerEdges is a string (enclosed in double quotes) specifying the leaf cells in a grown cell from which to propagate the power pins. Leaf cells are specified by the edges they fall on. Power pins cannot be propagated from leaf cells not on an edge. Edges are specified the same as in t_sides where "t" specifies top, "b" specifies bottom, "l" specifies left and "r" specifies right. Spaces within the side specifier string mean OR and no space between side specifiers means AND. Only relevant to the physical view. To take power pins from the corner leaf cells "tl tr bl br", would be specified. Defaults to "l t" which specifies power pins from leaf cells on the left or top edges will become power pins in the grown cell.

l_pinAndSides2 is a list specifying symbol pins and what side they should go on in the new symbol. The list should have the following format:

list(t_pinName t_sides [n_space] [t_pinName t_sides [n_space]] . . . )

t_sides is a string consisting of the first letter of the sides on a symbol. To specify all sides, t_sides would be "tblr", where "t" specifies top, "b" specifies bottom, "l" specifies left and "r" specifies right. Has also been used to put a pin on one side multiple times such as "ttt".

n_space specifies the number of pin spaces to leave between the pin t_pinName and the previous pin on the symbol. Defaults to 1.

l_busSignals specifies the names of buses that should be split across the schematic. Optionally, allows for buses to not be consecutive on the sides of the array of cells placed. This can be used to interleave a bus on alternate sides of a cell. The list should be in the following format:

list(t_pinName [x_1Index] [t_pinName [x_1Index]] . . . )

x_1Index specifies the first index on the first side encountered for signal t_pinName. The next t_pinName found on this side will be indexed 2 greater than the previous. Only "0" or "1" currently supported.

Options invoked by keyed arguments descriptions:

?am4, add metal 4, specifics to add fourth level metal power and ground buses. Also adds top level macro requirements and snaps "CLK" pins. More details listed under lt_topm4opt above. Defaults to nil.

?apt, add port text, specifies to add text to physical ports listed. Defaults to nil.

?bx, bump x-direction, specifies to bump out the right side of the new symbol by n_bump amount.

?by, bump y-direction, specifies to bump out the top side of the new symbol by n_bump amount.

?do, l_boxCoords, defines physical outline box. Overrides upper right or both upper left coordinates for the "GROWBOX" shape that is put into the physical.

?fps, forced pin sides, forces pins to be on specified sides of the new symbol as directed by l_pinAndSides2. Can also be used to accommodate custom pin spacings.

?in, make input pin, forces pins listed by l_pinNames to become input pins in the cell being created.

?io, make inputOutput pin, forces pins listed by l_pinNames to become inputOutput pins in the cell being created.

?mg, make global pin, forces pins listed by l_pinNames to be global pins.

?note, note, creates a note on the symbol of the cell being grown. Specified by the list l_noteSpec.

?nps, no alphabetical pin sort, specifies to place the symbol pins, on sides specified by t_sides, by their location in the schematic, rather than by alphabetically sorting each side.

?out, make output pin, forces pins listed by l_pinNames to become output pins in the cell being created.

?pm, pin map, specifies to map pins from one name to another as specified in l_mapList. Do not map pins to names that are already on that side. The bits in the resultant bus may differ between the physical and the schematic. Swapping pin names on a given side is allowed.

?pvg, port vdd and gnd sides, specifies to propagate vdd and gnd ports from cells on the edges specified.

?sb, separate bus, specifies that pins listed in l_busSignals that appear on opposite sides of a cell will not be shorted. Instead the pin width will be expanded to create a bigger bus.

?sp, snap port to grid, will snap rectangular shapes in physical ports listed in l_pinNames to the routing grid.

The value returned:

l_boxCoords returns a listing of the grown cells GROWBOX coordinates. This is only useful when growing physicals, but is still reported for schematics. If the grow is unsuccessful the culprit error will be reported.

Figure 3A:
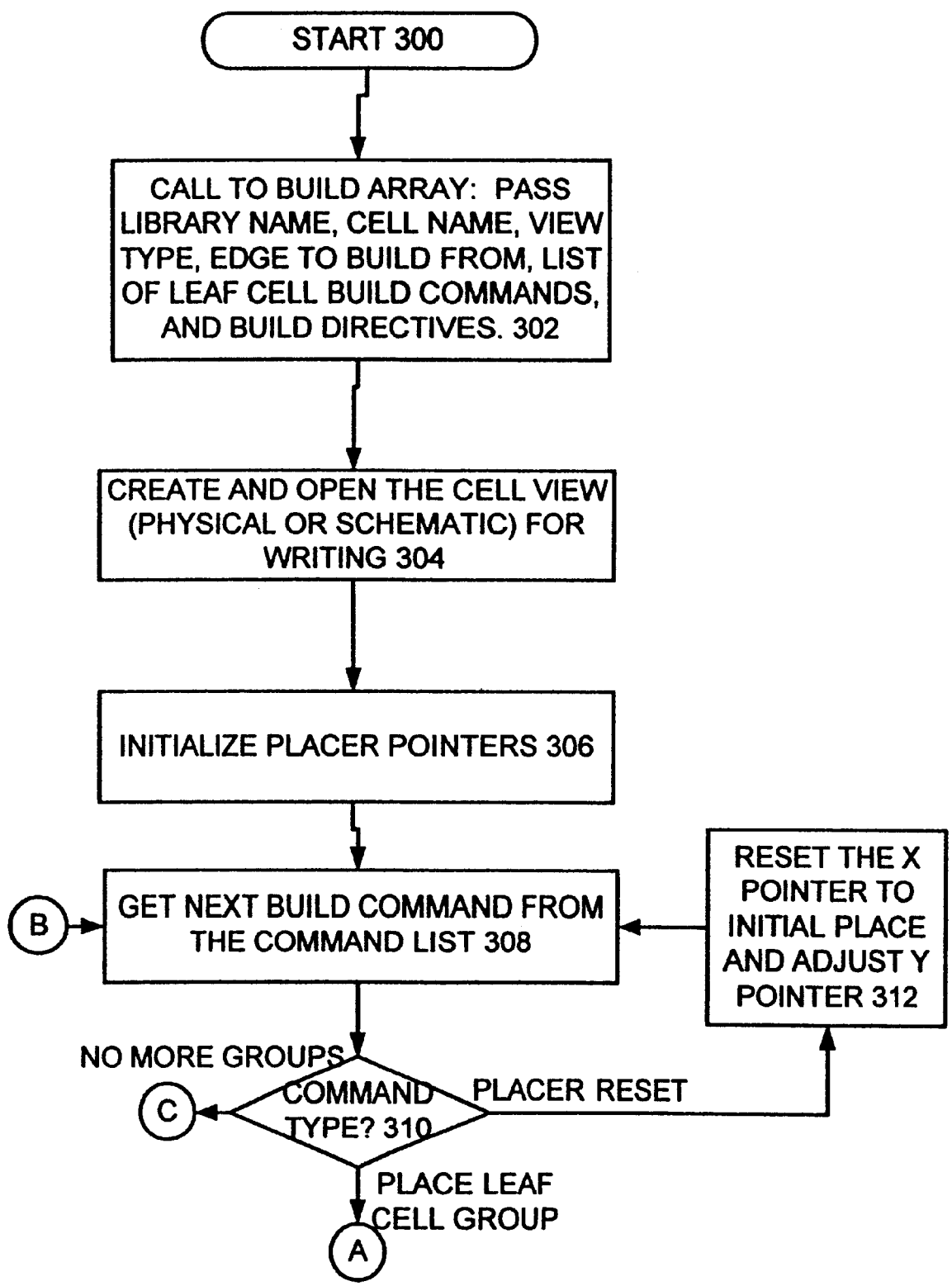

Referring to FIG. 3A, the cell view, physical or schematic, is created and opened for writing as indicated at a block 304. X and Y placer pointers are initialized as indicated at a block 306. A next build command from the command list is obtained as indicated at a block 308. A command type is identified as indicated at a decision block 310. Responsive to an identified placer reset command (x_dirReset) at decision block 310, the X pointer is reset to the initial place and the Y pointer is adjusted as indicated at a block 312. This assumes that X is the major axis and Y is the minor axis; however, it should be understood that the methods of the preferred embodiment are not limited to this assumption. Then a next build command from the command list is obtained at block 308.

Figure 3B:
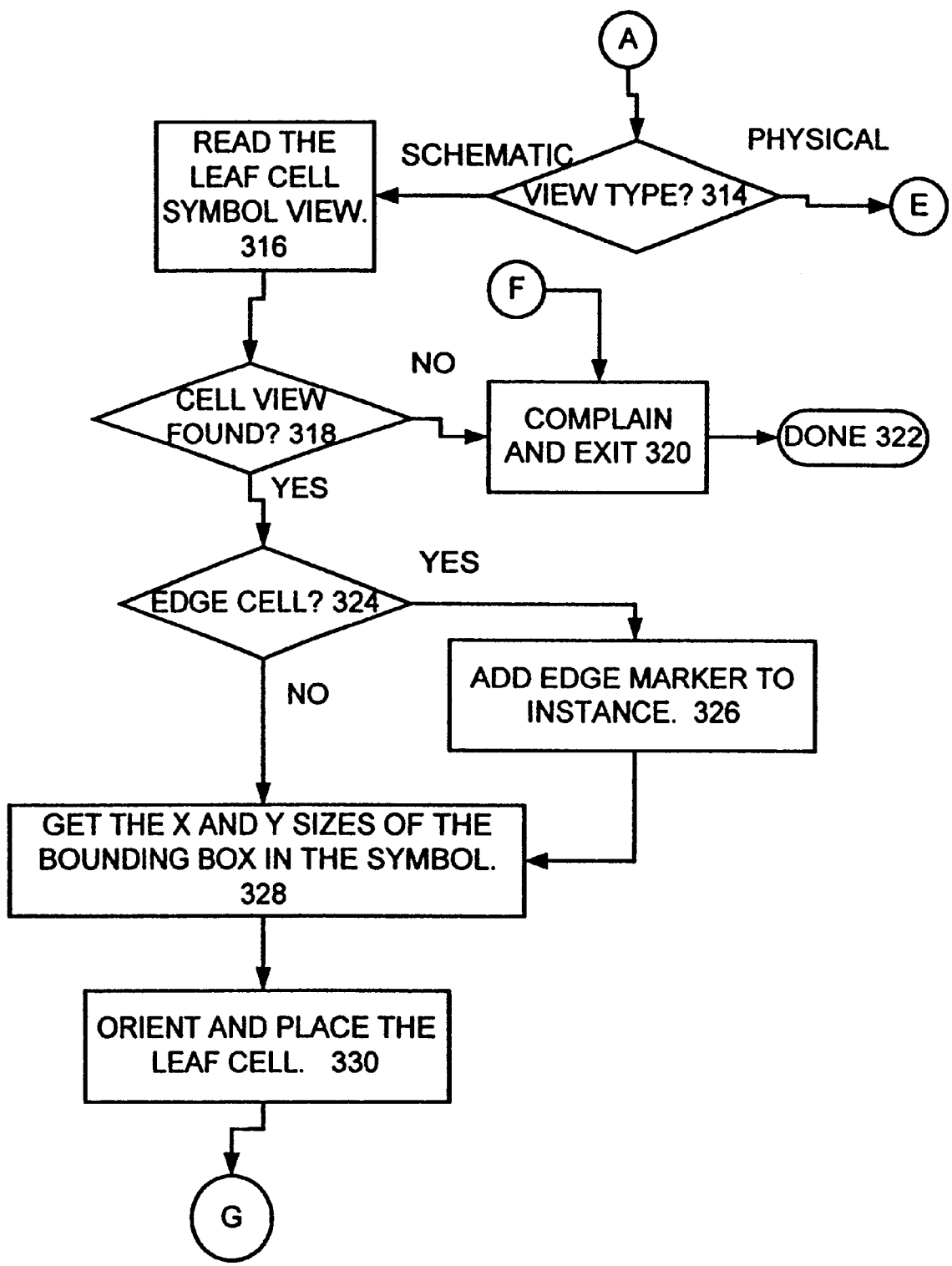

Responsive to an identified place leaf cell group command at decision block 310, a view type is identified as indicated at a decision block 314 in FIG. 3B. Responsive to an identified schematic view type, the leaf cell symbol view is read as indicated at a block 316. If the leaf cell view is not found as indicated at a decision block 318, then an error is returned and buildArray is exited as indicated at blocks 320 and 322. This ends the buildArray sequence as indicated at a block 322. If the leaf cell view is found, checking for an edge cell is performed as indicated at a decision block 324. When an edge cell is found, an edge marker is added to the edge cell instance as indicated at a block 326. The X and Y sizes of the bounding box in the symbol for the leaf or edge leaf cell are obtained as indicated at a block 328. Then the leaf cell is oriented and placed as indicated at a block 330.

Figure 3C:
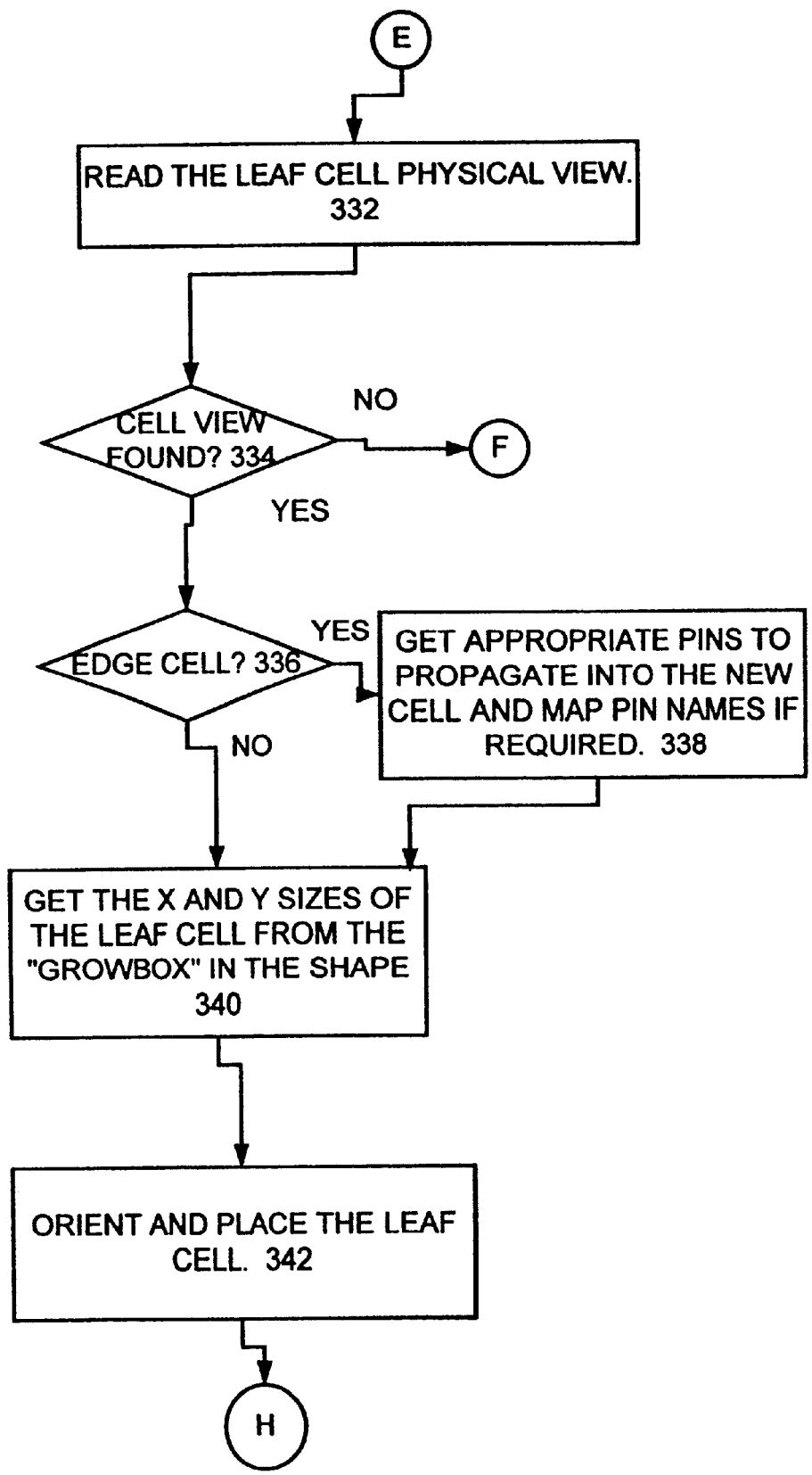

Referring to FIG. 3C, when a physical cell view is identified at decision block 314, then following entry point E, the leaf cell physical view is read as indicated at a block 332. If the cell view is not found at a decision block 334, then the sequential operations return to block 320 in FIG. 3B following entry point F to end the buildArray routine. Checking for an edge leaf cell is performed as indicated at a decision block 336. Responsive to an identified edge leaf cell, the appropriate pins to propagate into the new cell are obtained, and pin names are mapped if required, as indicated at a block 338. The X and Y sizes of the "GROWBOX" shape are obtained as indicated at a block 340 and then the leaf cell is oriented and placed as indicated at a block 342.

Figure 3D:
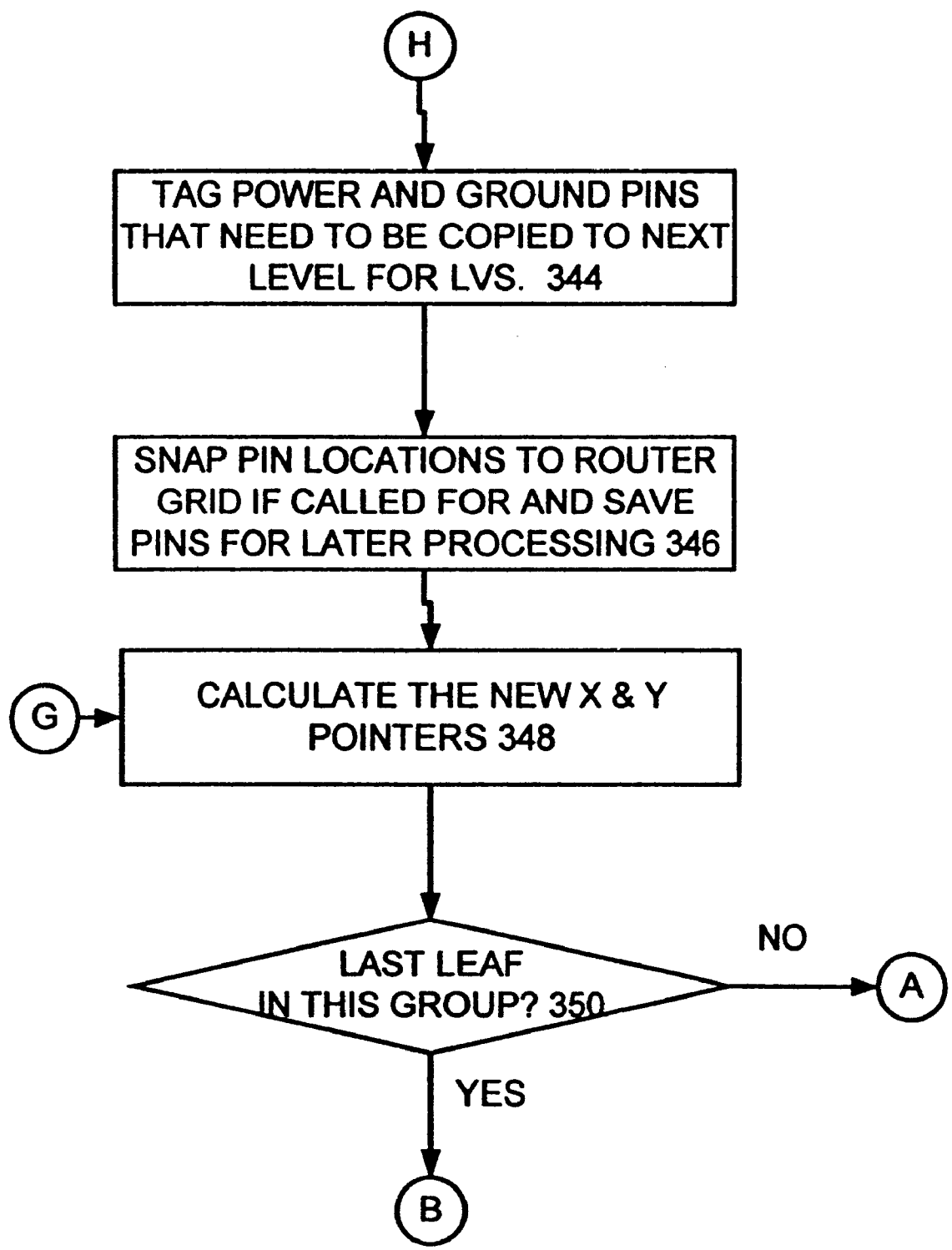

Referring to FIG. 3D, the power and ground pins that need to be copied to the next level for LVS are tagged as indicated at a block 344. Pin locations are snapped to the router grid if necessary and the pins are saved for later processing as indicated at a block 346. The new X and Y pointers are calculated as indicated at a block 348. Checking whether this is the last leaf in this group is performed as indicated at a decision block 350. If not, then the sequential operations return to block 314 following entry point A in FIG. 3B. Otherwise when this is the last leaf in this group, then the sequential operations return to block 308 following entry point B in FIG. 3A.

Figure 3E:
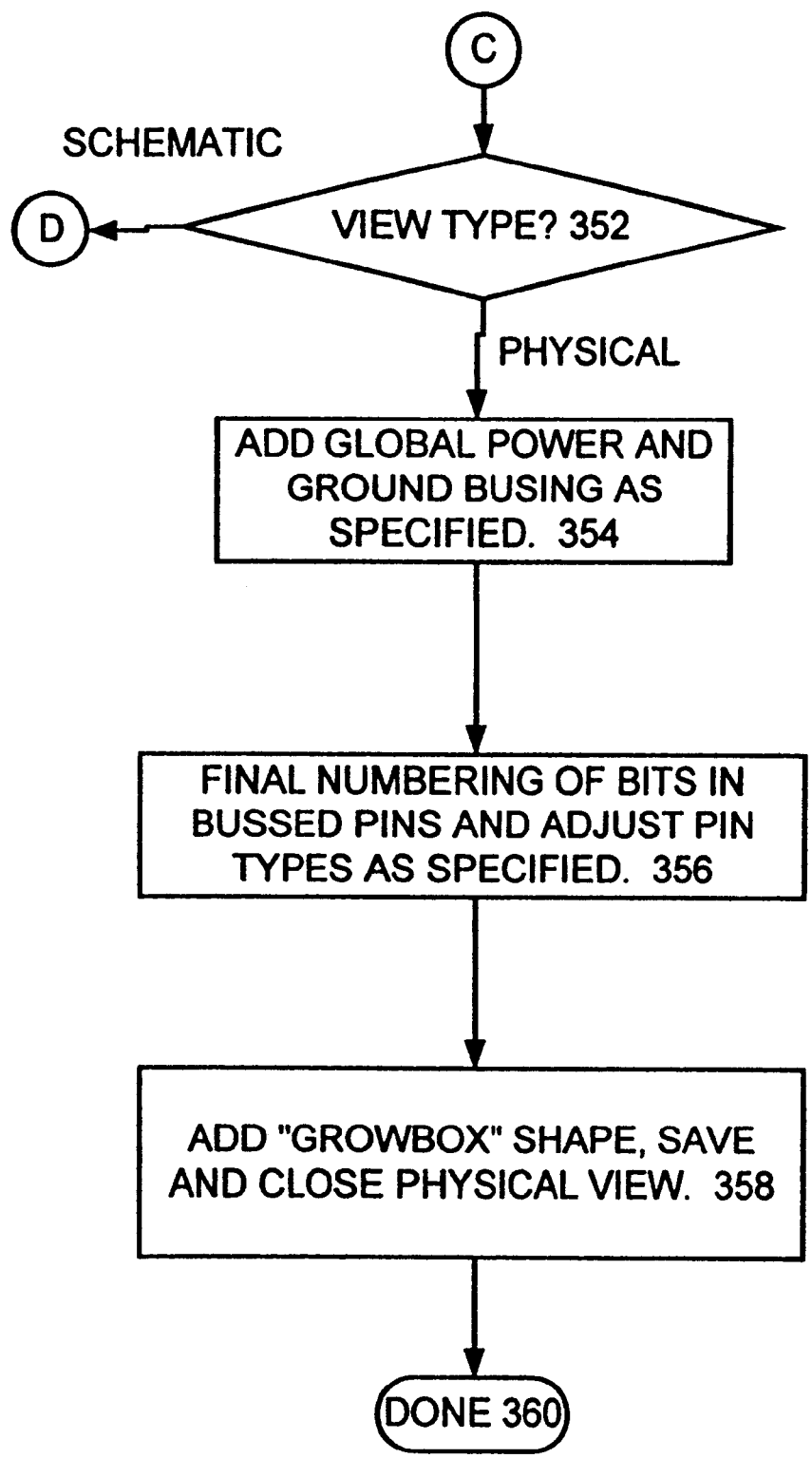

Referring to FIG. 3E, when no more groups are identified at decision block 310 in FIG. 3A, then a view type is identified at decision block 352. Responsive to an identified physical view type, global power and ground busing are added as specified as indicated at a block 354. Then final numbering of bits in bussed pins and adjusting pin types as specified is provided as indicated at a block 356. The "GROWBOX" shape is added to define the size of the new leaf cell, and the physical view is saved and closed as indicated at a block 358. This completes the physical buildArray processing as indicated at a block 360.

Figure 3F:
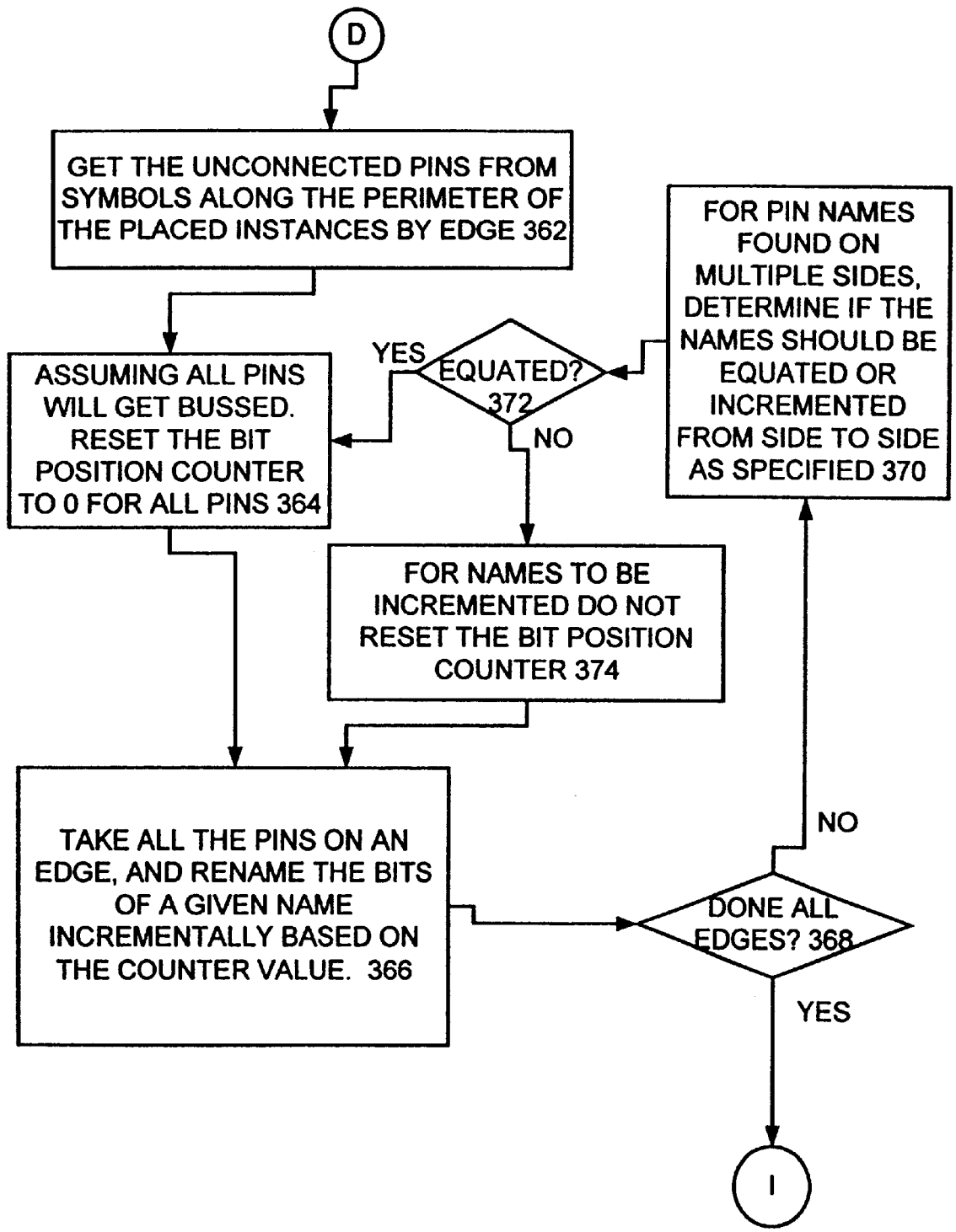

Referring to FIG. 3F, responsive to an identified schematic view type at decision block 352 in FIG. 3E, then the unconnected pins are obtained from the symbols along the perimeter of the placed leaf cell instances as marked in block 326 in FIG. 3B by edge as indicated at a block 362. Assuming that all pins will get bussed, the bit position counters are reset to zero for all pins as indicated at a block 364. All the pins on an edge are obtained and the bits of a given name are renamed incrementally based on the counter value as indicated at a block 366. Checking whether all edges are done is provided as indicated at a decision block 368. If not, for pin names found on multiple sides, it is determined if the names should be equated or incremented from side to side as specified as indicated at a block 370. If determined that the names should be equated as indicated at a decision block 372, then the sequential operations return to block 364. Otherwise, if the names should not be equated, then for names to be incremented the bit position counter is not reset as indicated at a block 374. Then all the pins on an edge are obtained and the bits of a given name are renamed incrementally based on the counter value at block 366. When determined that all edges are done at decision block 368, then the sequential operations continue in FIG. 3G following entry point I.

Figure 3G:
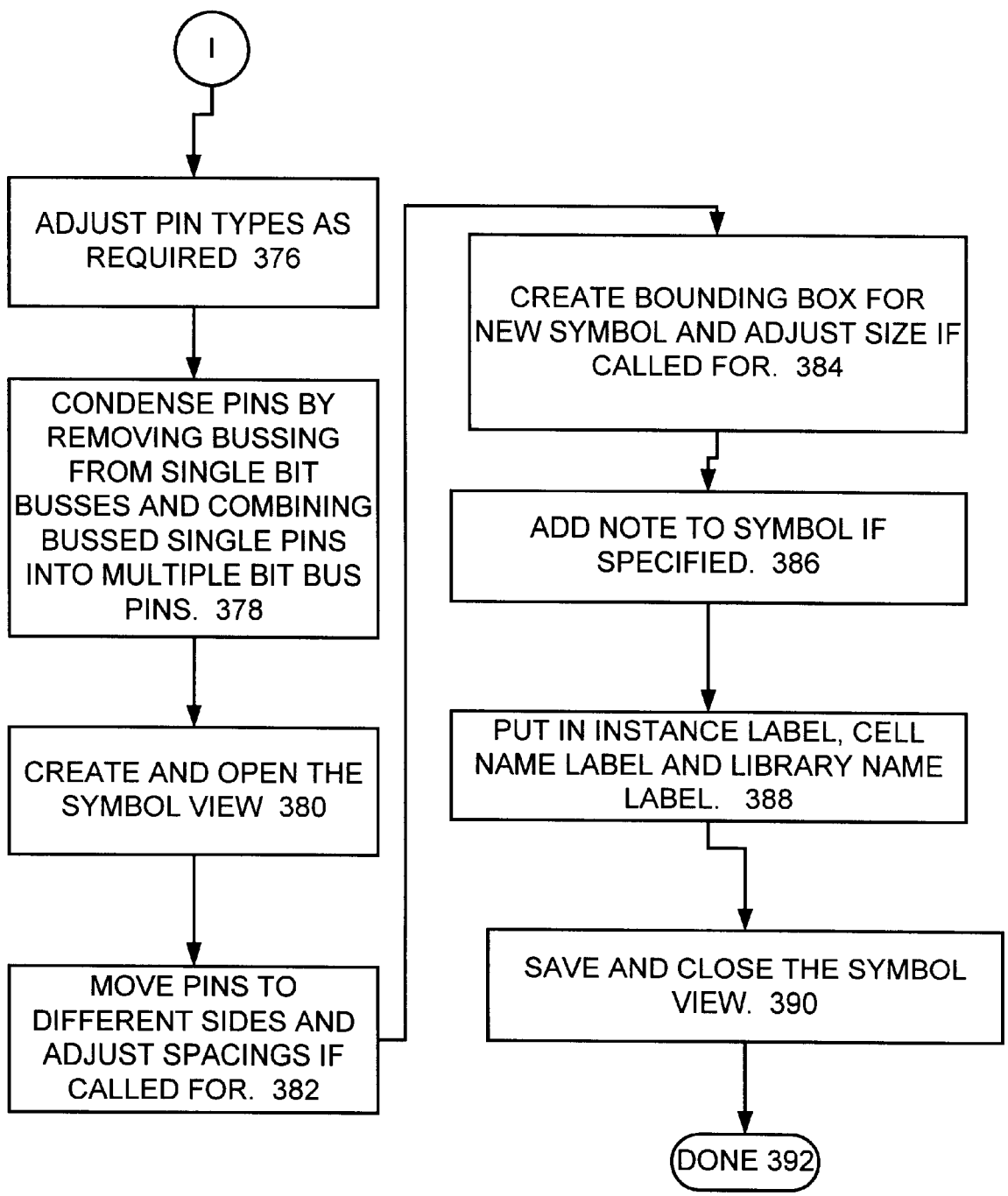
Figure 4A:
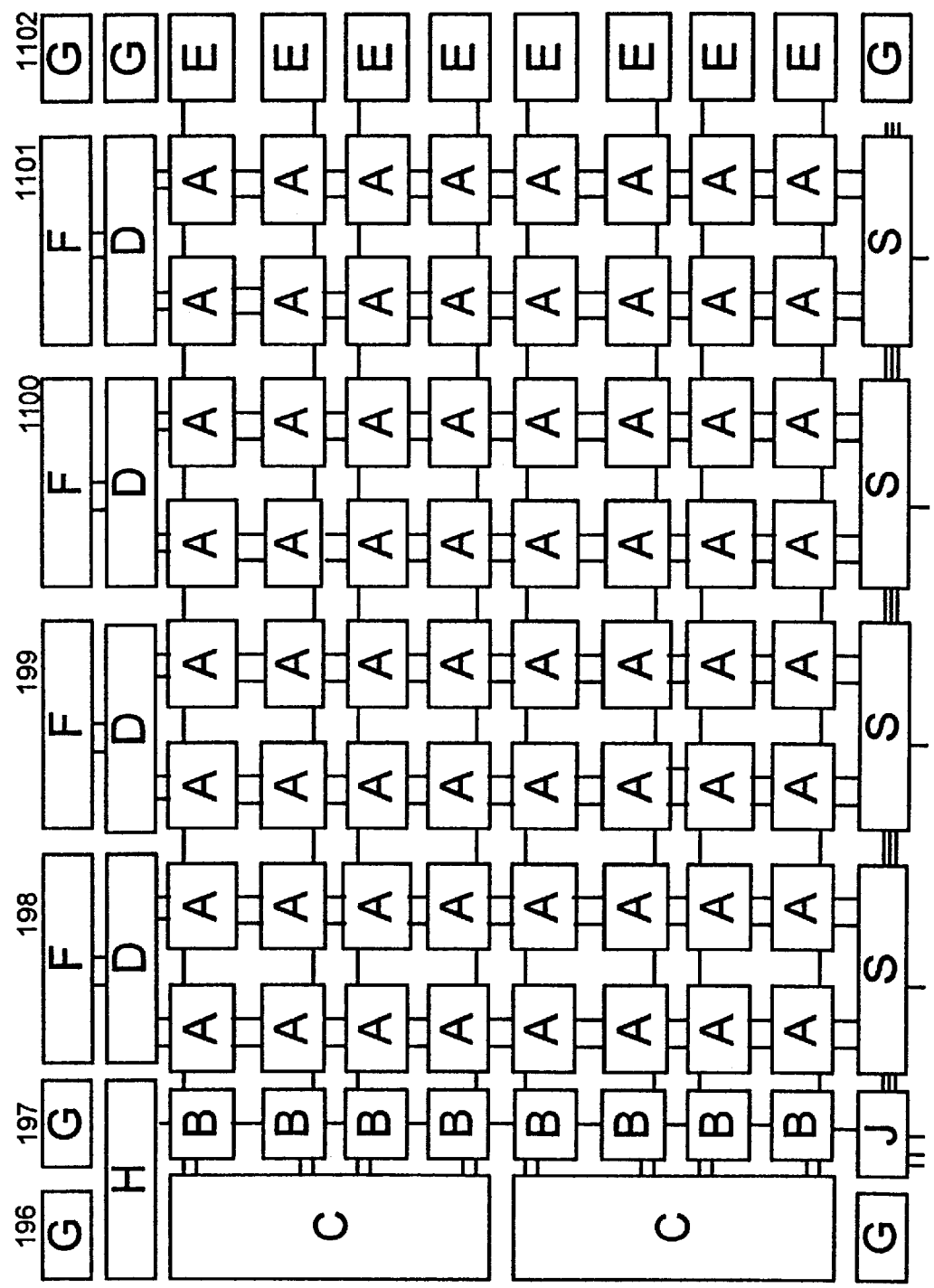
FIGS. 4A and 4B are respective schematic and physical exemplary flat tile representations created in accordance with the preferred embodiment.
Figure 4B:
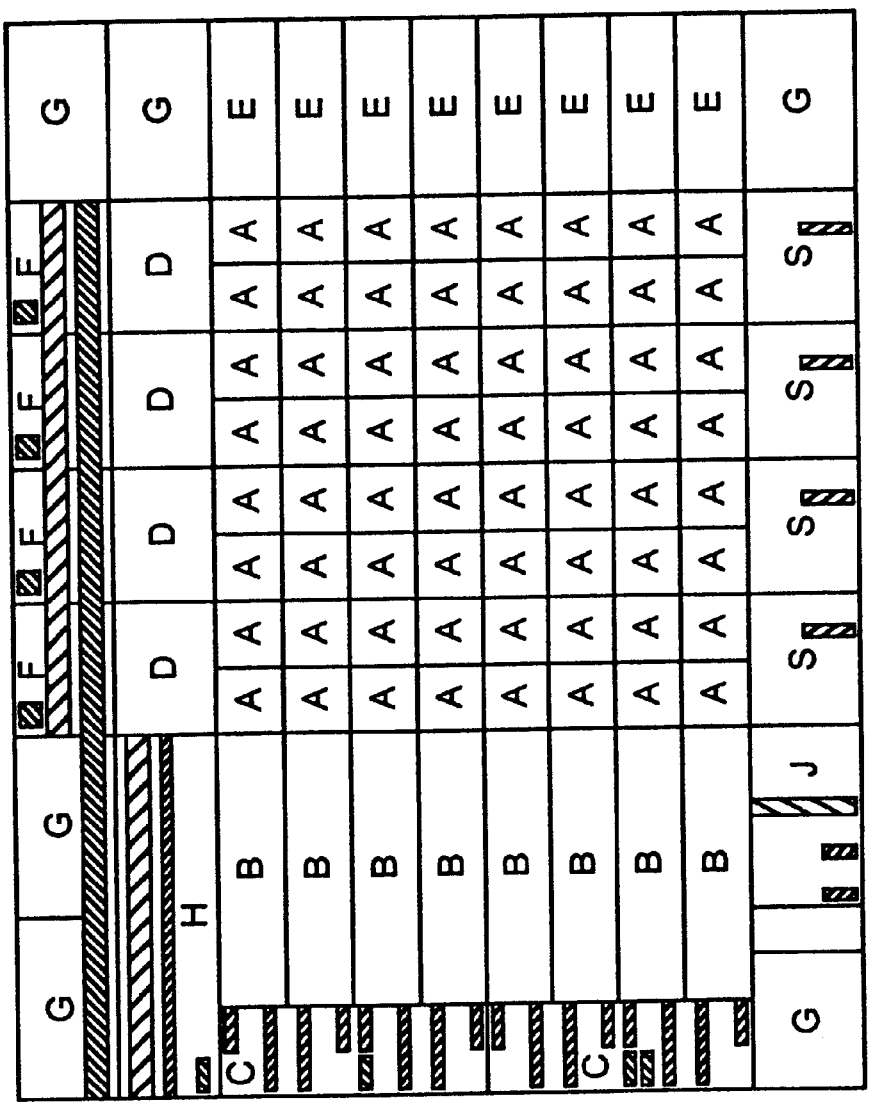

Referring to FIG. 3G, pin types are adjusted as required as indicated at a block 376. The pins are condensed by removing bussing from single bit busses and combining bussed single pins into multiple bit buss pins as indicated at a block 378. The symbol view is created and opened as indicated at a block 380. Pins are moved to different sides and spacings are adjusted if required as indicated at a block 382. The bounding box for the new symbol is created and the size is adjusted if required as indicated at a block 384. A note is added to the symbol if specified as indicated at a block 386. An instance label, cell name label and library name label are added as indicated at a block 388. Then the symbol view is saved and closed as indicated at a block 390. This ends the buildArray sequence as indicated at a block 392.

The following TABLE 2 provides an exemplary general procedure for calling buildArray of the preferred embodiment, as shown in FIG. 2.

Table 2

```
procedure (tutGen (@optional libN aName a Words aBits)
   prog((archDef adBits argList mkSch mkLay gwN fName)
   ;
      archDef="tutSpec"; name of file describing architec-
         ture
      gwN="Tutorial"; name at top of calling form
      ;
      ; load stuff
      load("/~grow/skill/
         tutSpec.il")
      ; define program name, get info and quit if form
         cancelled
      fName=strcat9gwN "Grow System")
      if(genGetInputForm(fName)==nil then return ())
      ; print time
      printf("++++++started at % s +++++++\n"
         getCurrentTime())
      ; do scematics?
      if(mkSch then
         argList=list(libN aName "schematic" aBits aWords
            adBits)
         apply(getd(concat(archDef)) argList)
      )
      ; do layout?
      if(mkLay then
         argList=list(libN aName "physical" aBits aWords
            adBits)
         apply(getd(concat(archDef)) argList)
      )
      ; print time
      printf("++++++finished at % s +++++++\n"
         getCurrentTime())
      return(t)
   )
)
```

Having reference to TABLE 3 below and FIGS. 4–16, the operation of the hierarchical tiler (buildAarray) of the preferred embodiment may be understood.

Table 3: Exemplary Specification

```
procedure(tutSpec(1N aName vt bts wls adBt)
let((qW1 bt2)
; quarter the word lines and twice the number of bits
qWl=wls/4
bt2=bts*2
; build flat one here (Note the schematic flatTile in FIG. 4A
   and physical flatTile in FIG. 4B, which are simplified
   views for readability.)
buildArray(1N "flatTile" vt "1"
```

```
list (  1    1     "leaf_G"
        1    1     "leaf_J"
        1    bts   "leaf_S"
        1    1     "leaf_G"
       -1    qWl   1     "leaf_C"
             wls   1     "leaf_B" "YD"
             wls   bt2   "leaf_A" "XY"
             wls   1     "leaf_E" "YD"
       -1    1     1     "leaf_H"
             1     bts   "leaf_D"
             1     1     "leaf_G"
       -1    1     2     "leaf_G"
             1     bts   "leaf_F"
             1     1     "leaf_G"
     )
```

Figure 5A:
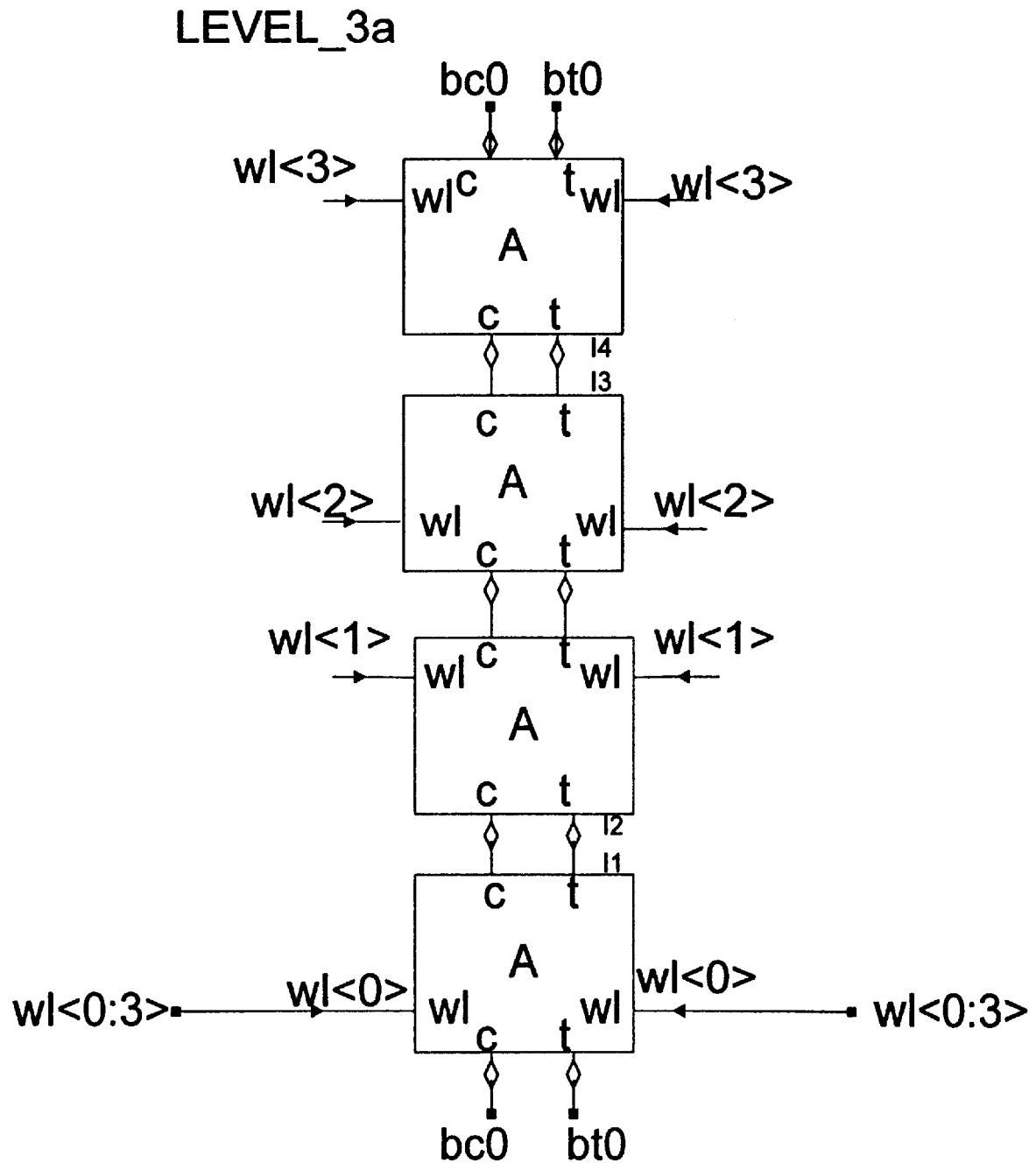
FIGS. 5A and 5B are exemplary third level representations created in accordance with the preferred embodiment.
Figure 5B:
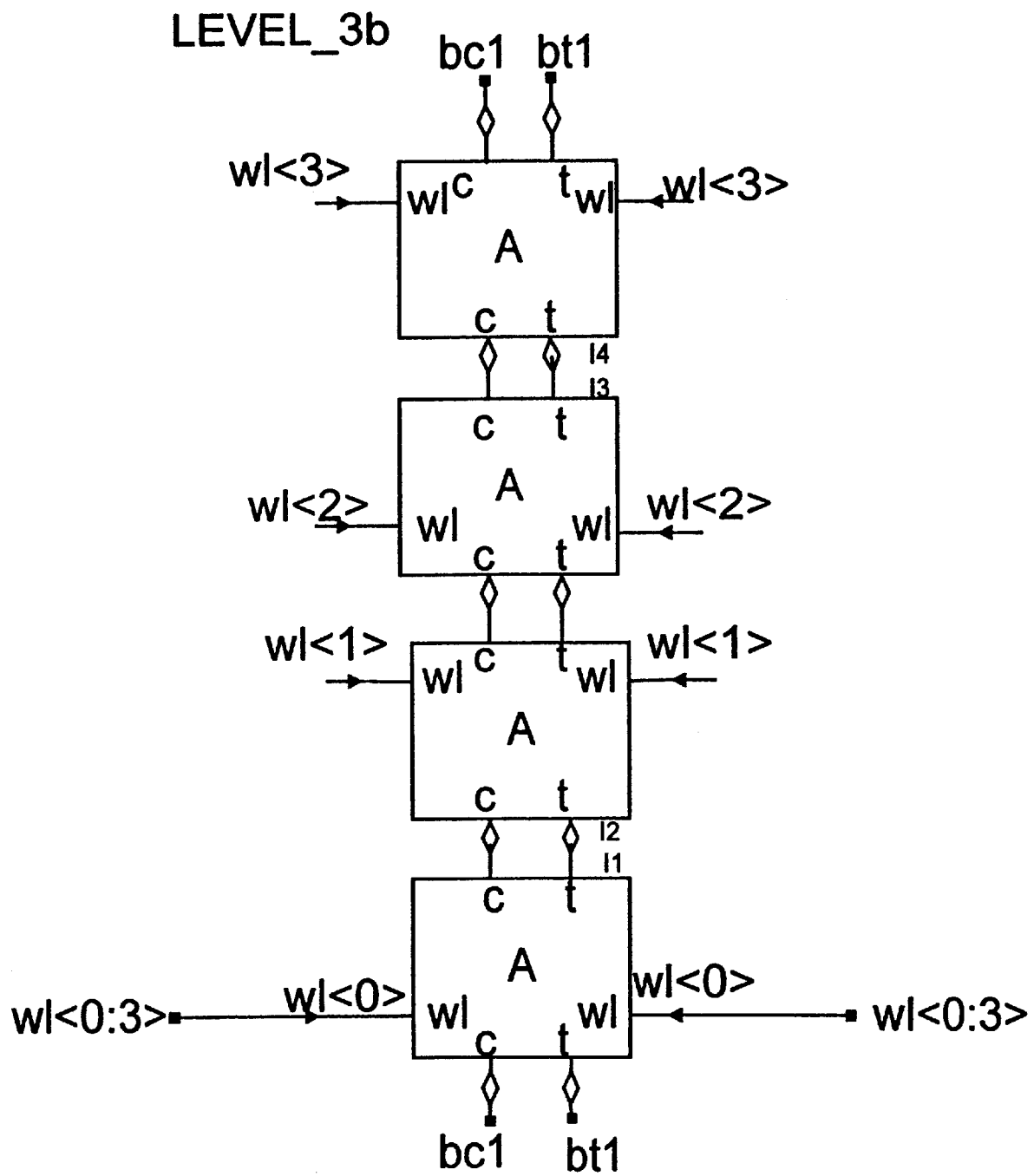
Figure 6A:
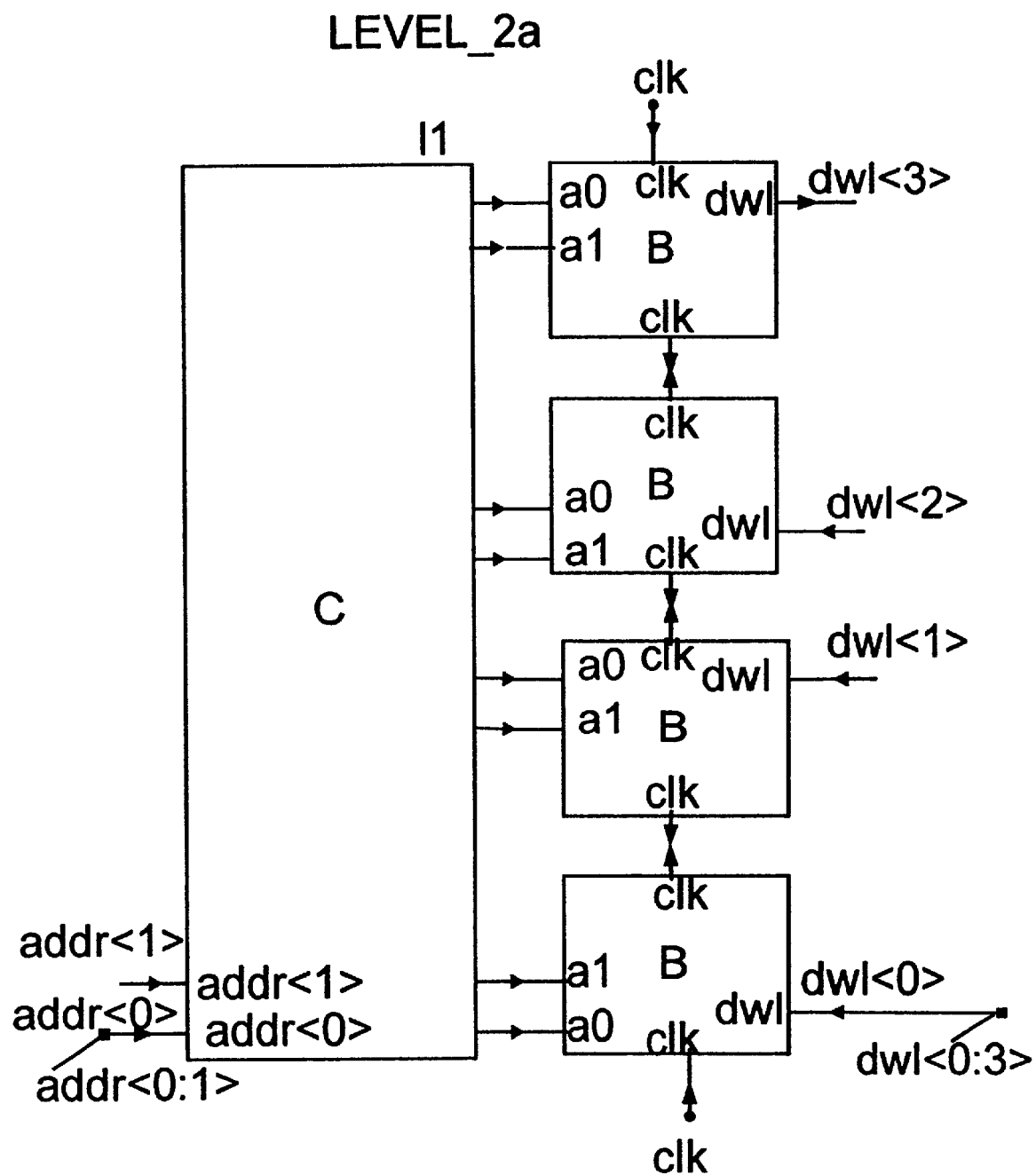
FIGS. 6A, 6B and 6C are exemplary second level representations created in accordance with the preferred embodiment.
Figure 6B:
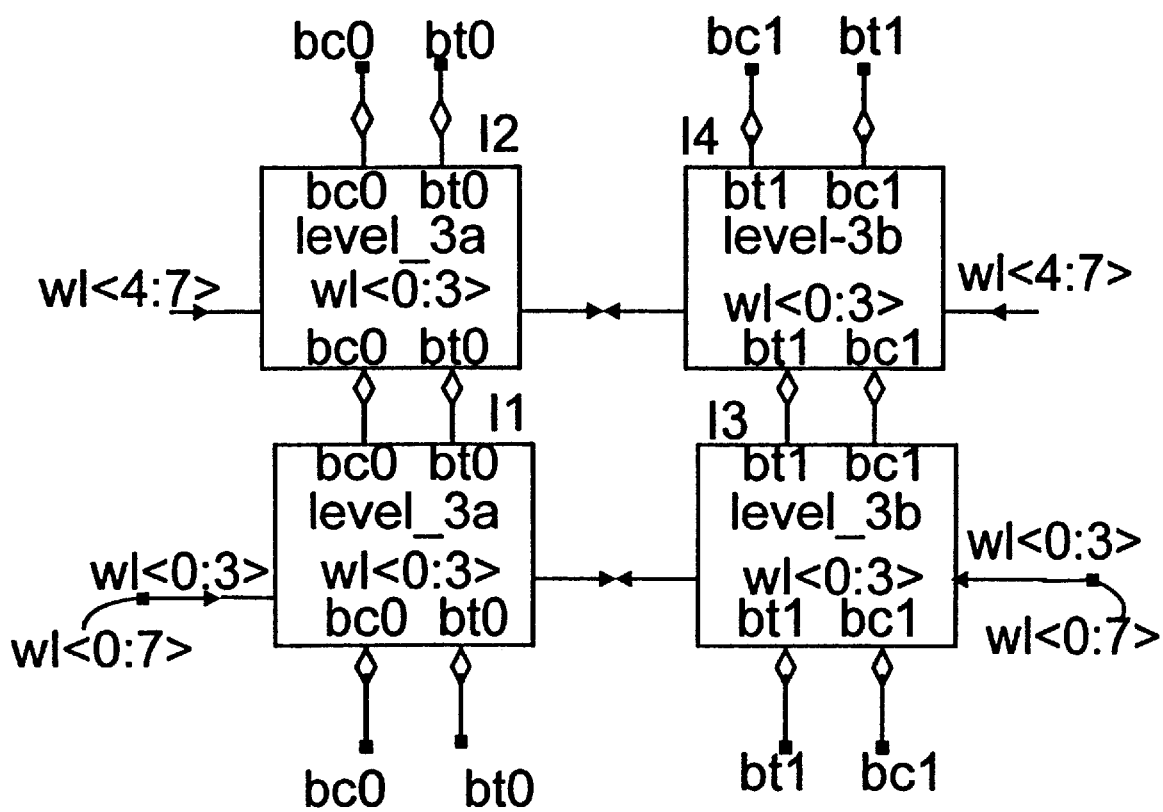
Figure 6C:
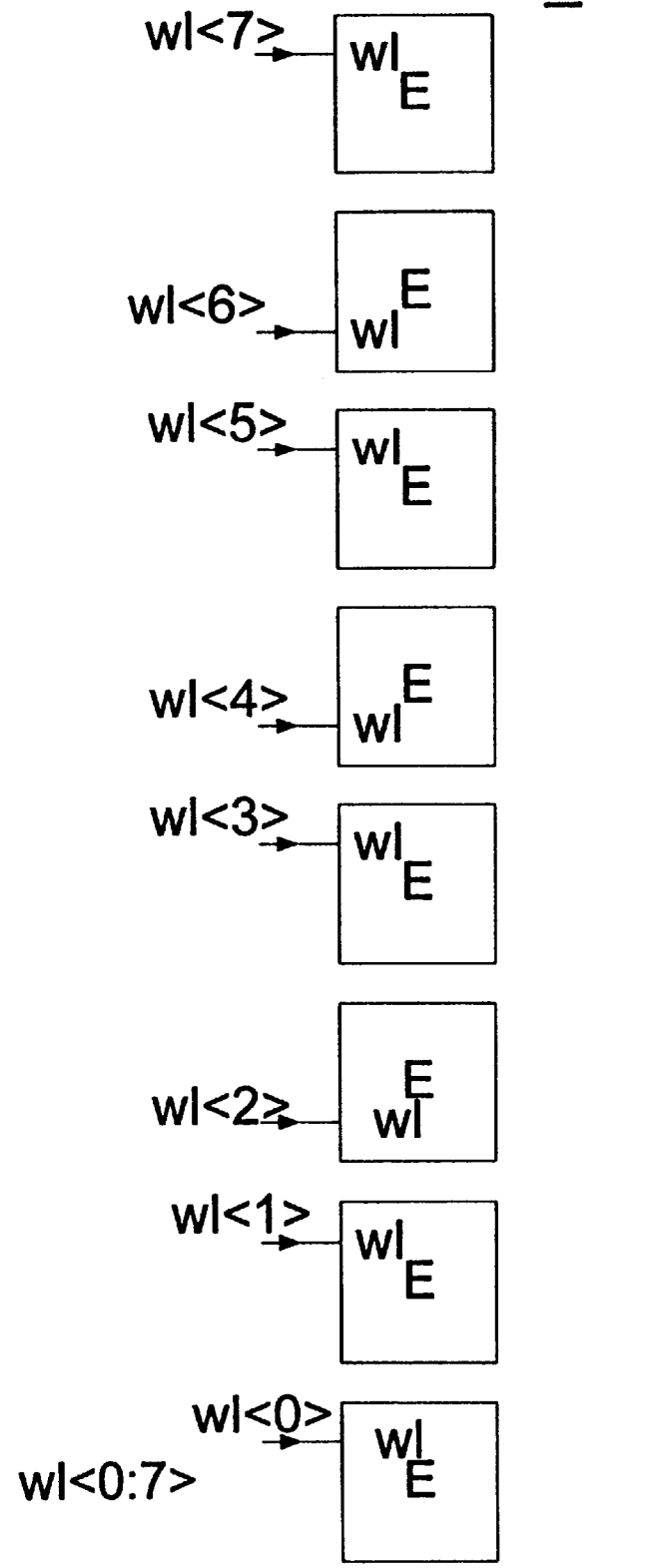
Figure 7A:
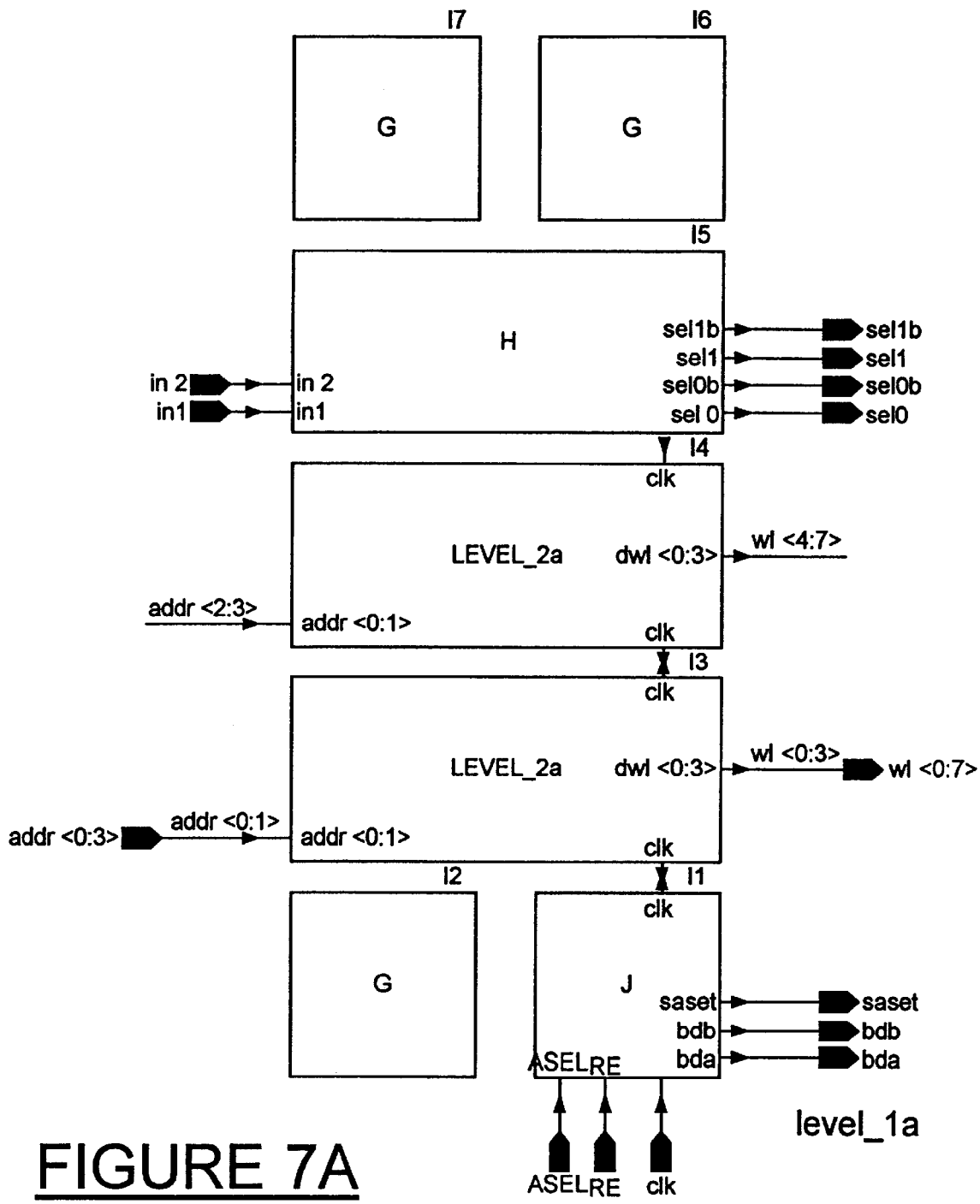
FIGS. 7A, 7B and 7C are exemplary first level representations created in accordance with the preferred embodiment.
Figure 7B:
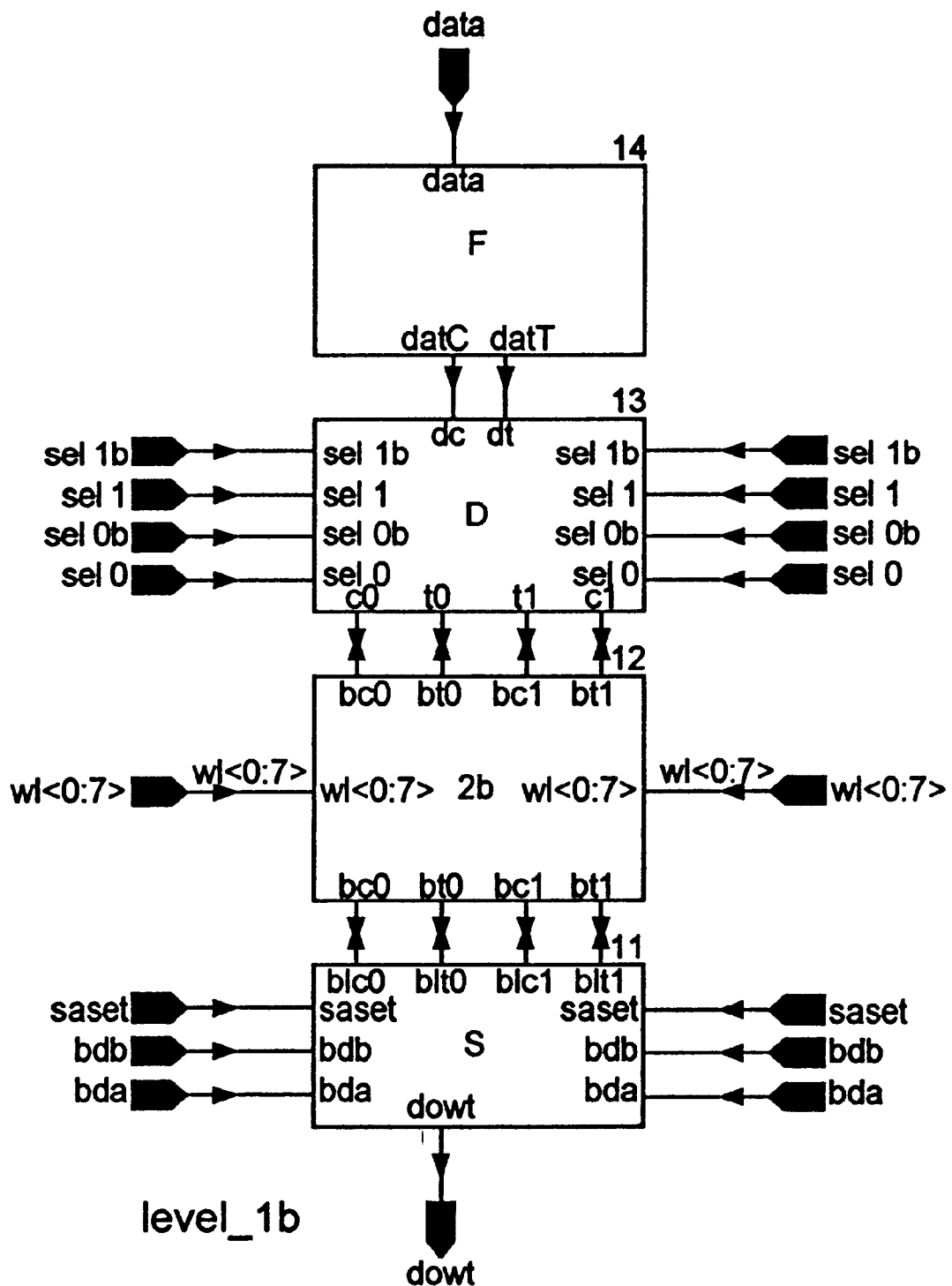
Figure 7C:
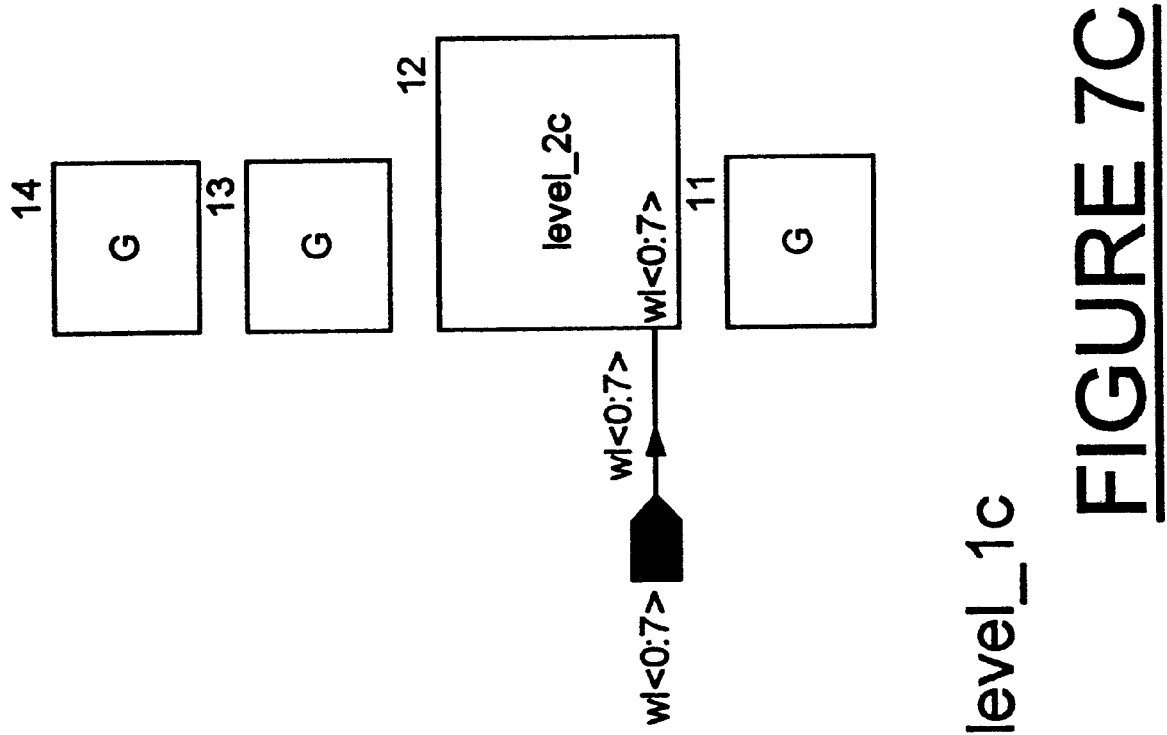
Figure 8A:
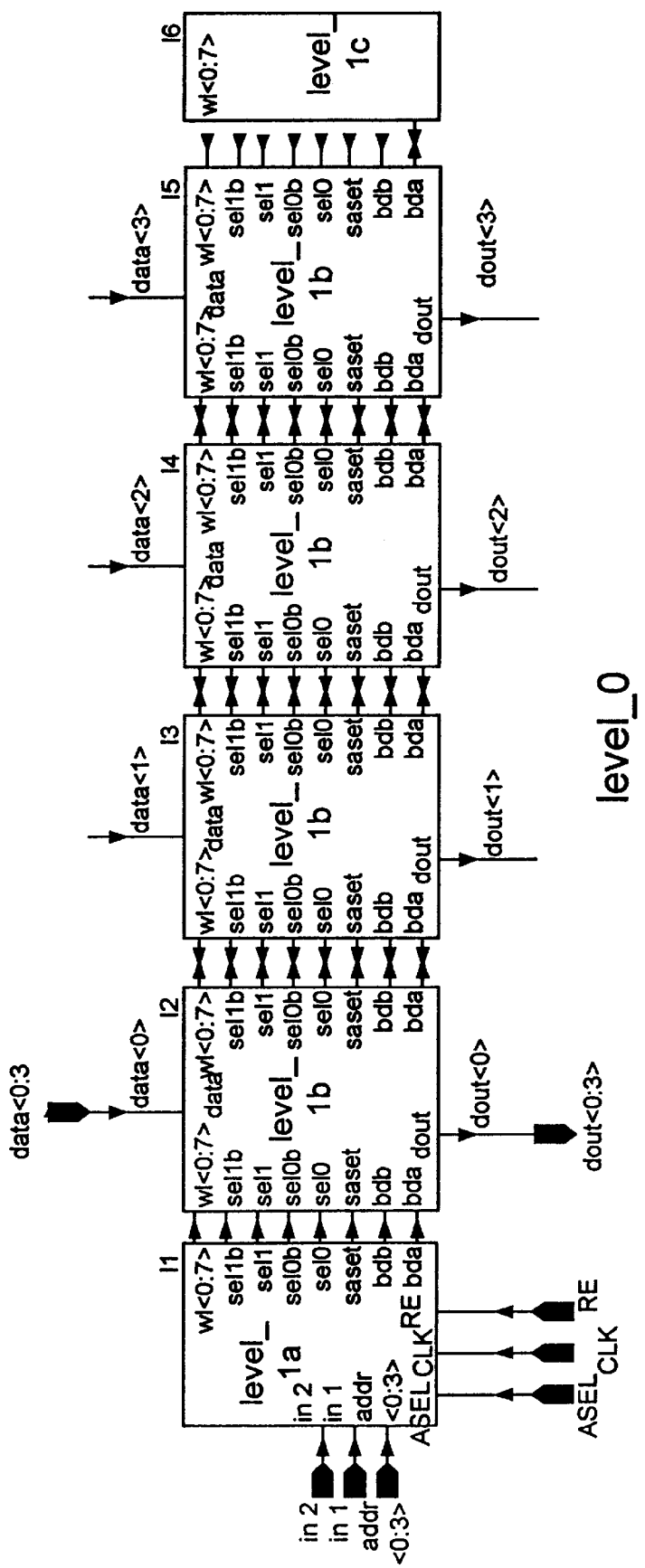
FIGS. 8A and 8B are respective schematic and physical exemplary zero level representations created in accordance with the preferred embodiment.
Figure 8B:
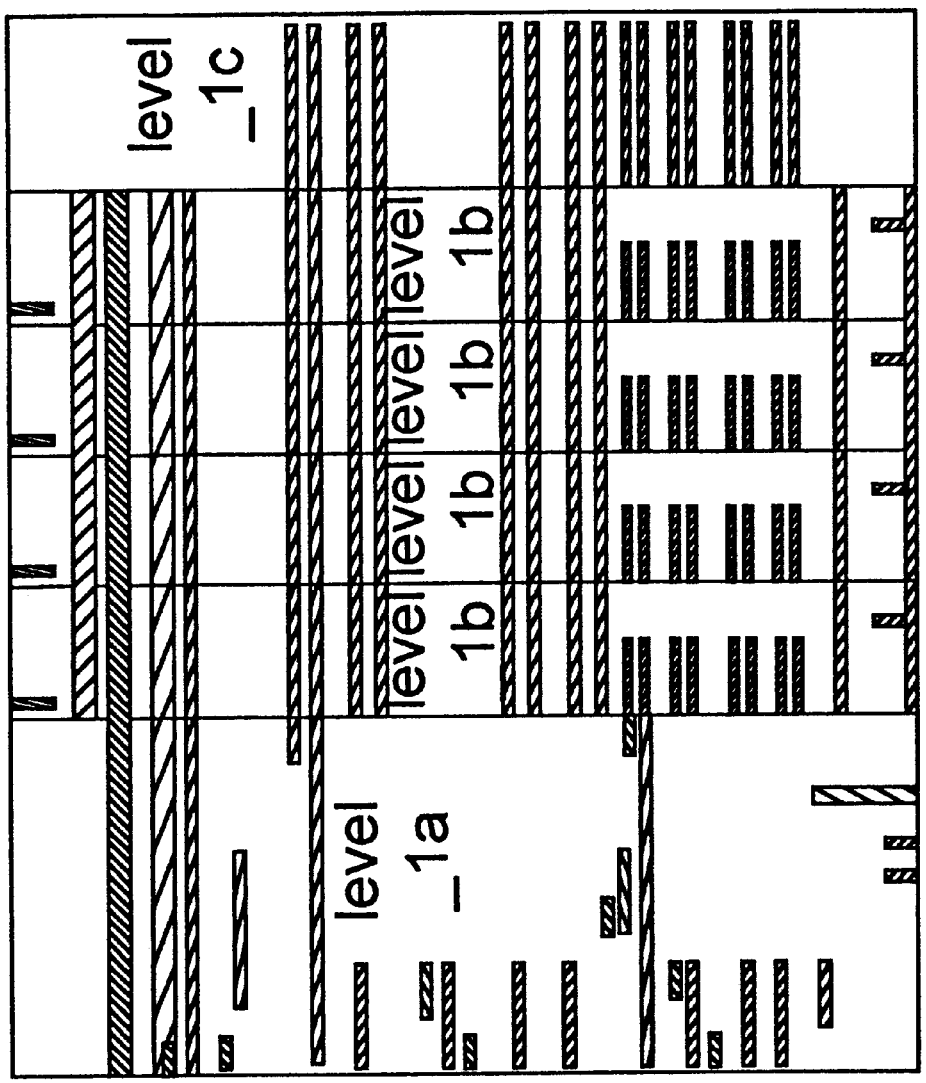
Figure 9:
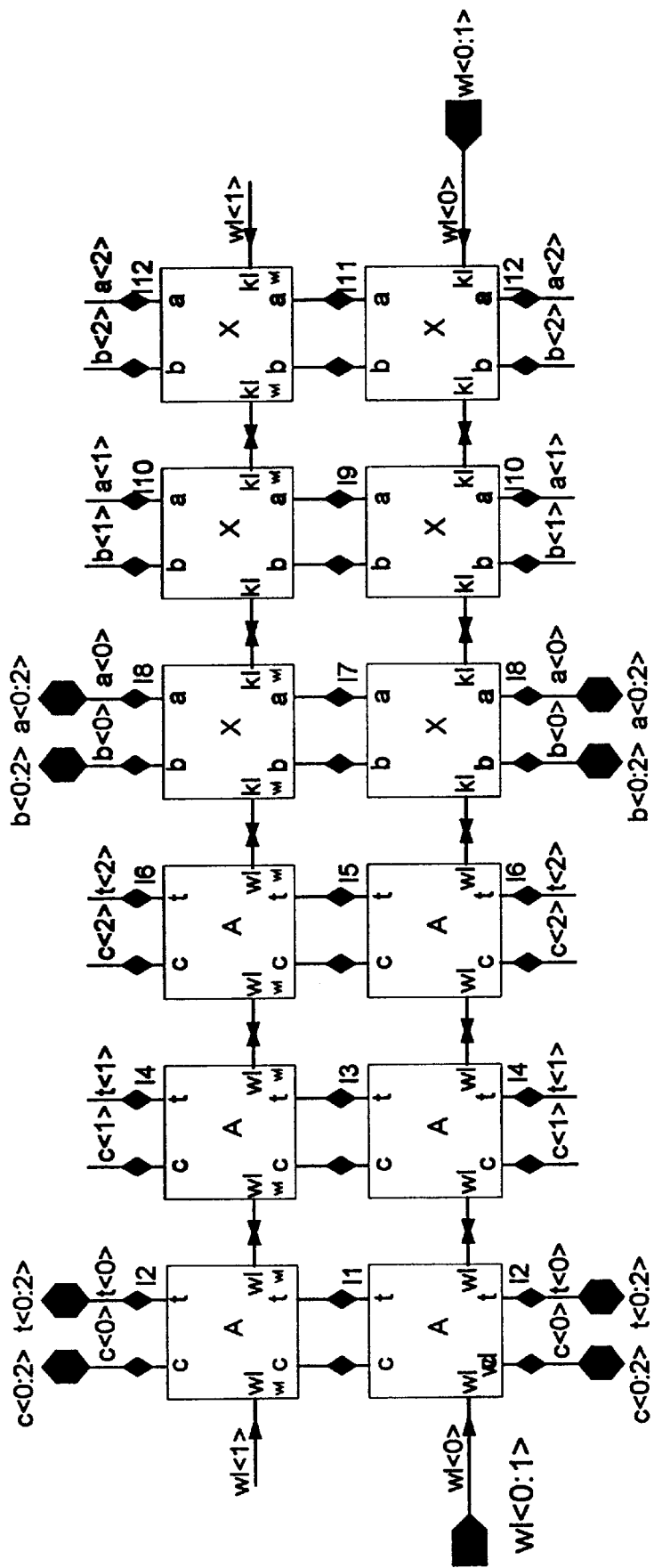
FIGS. 9, 10, 11, 12, 13, 14, 15 and 16 are exemplary demonstration representations created in accordance with the preferred embodiment.
Figure 10:
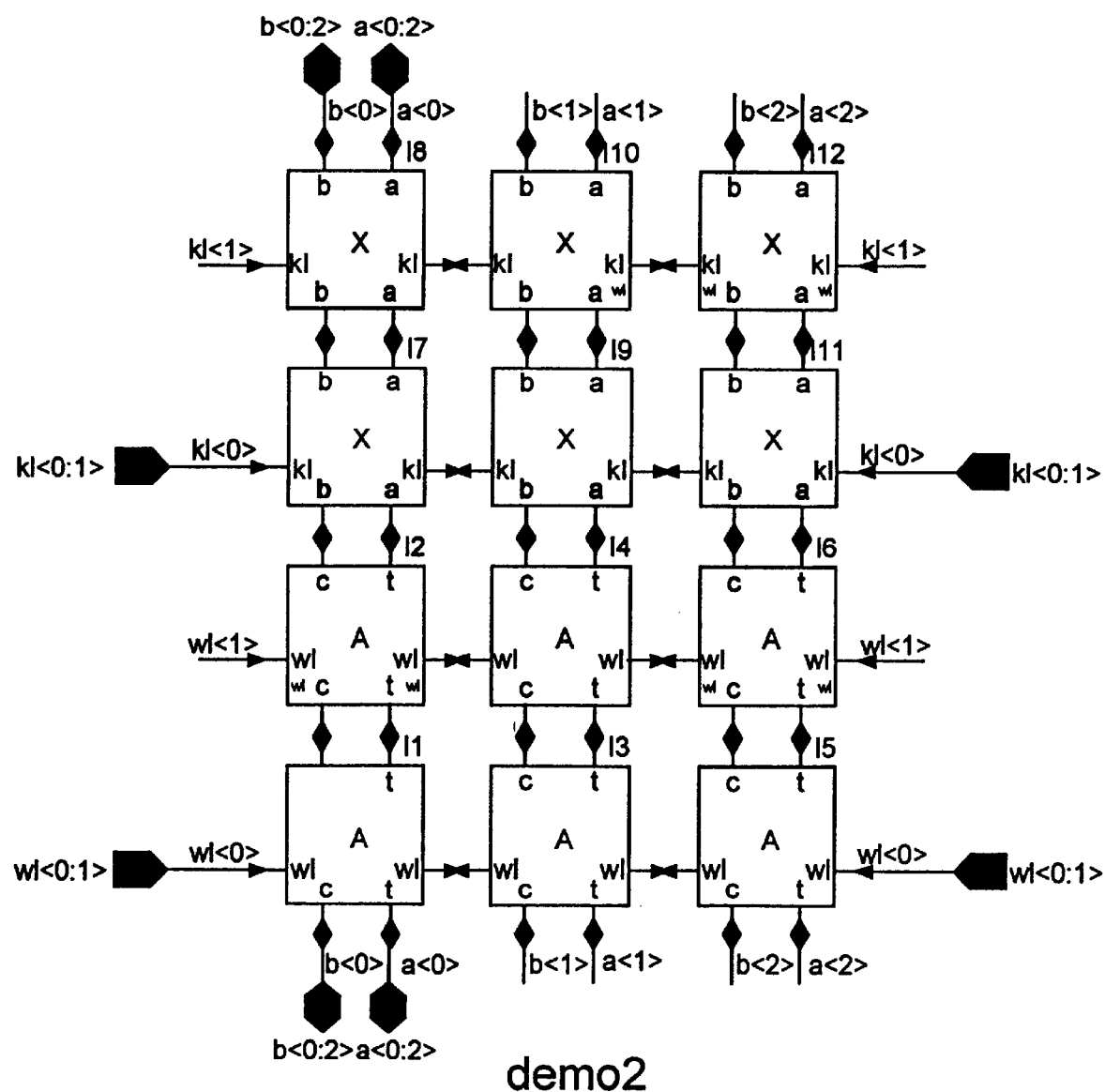
Figure 11:
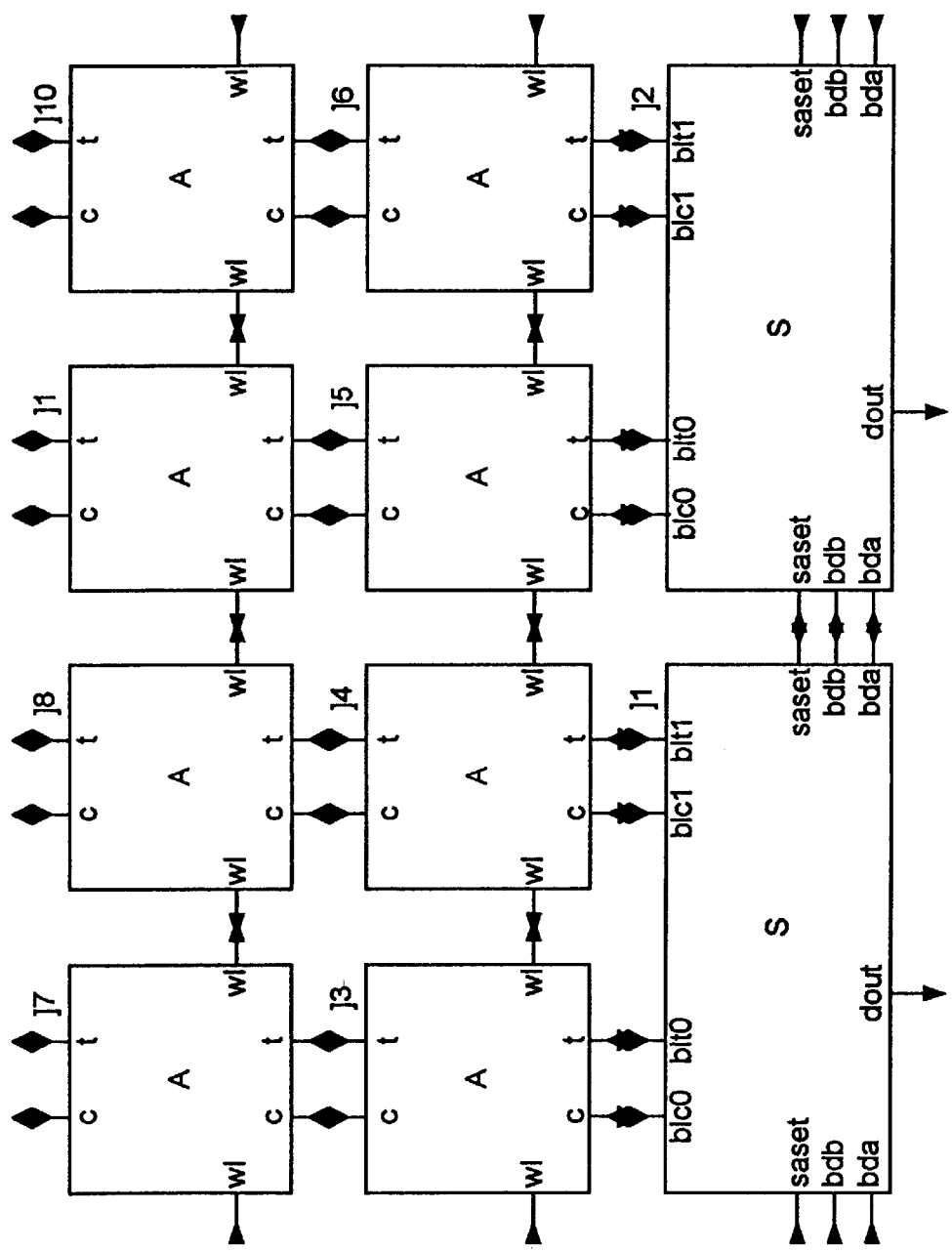
Figure 12:
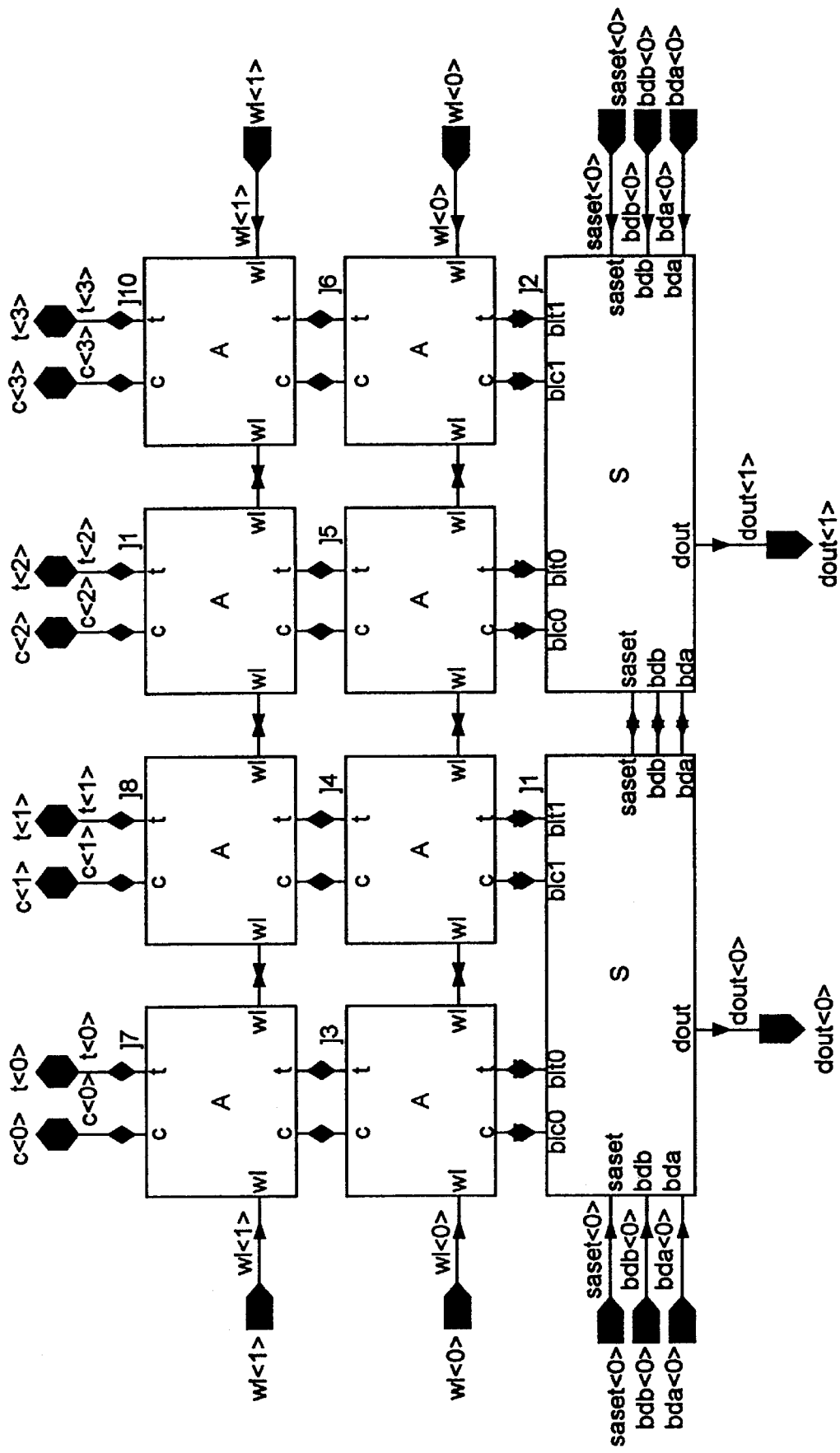
Figure 13:
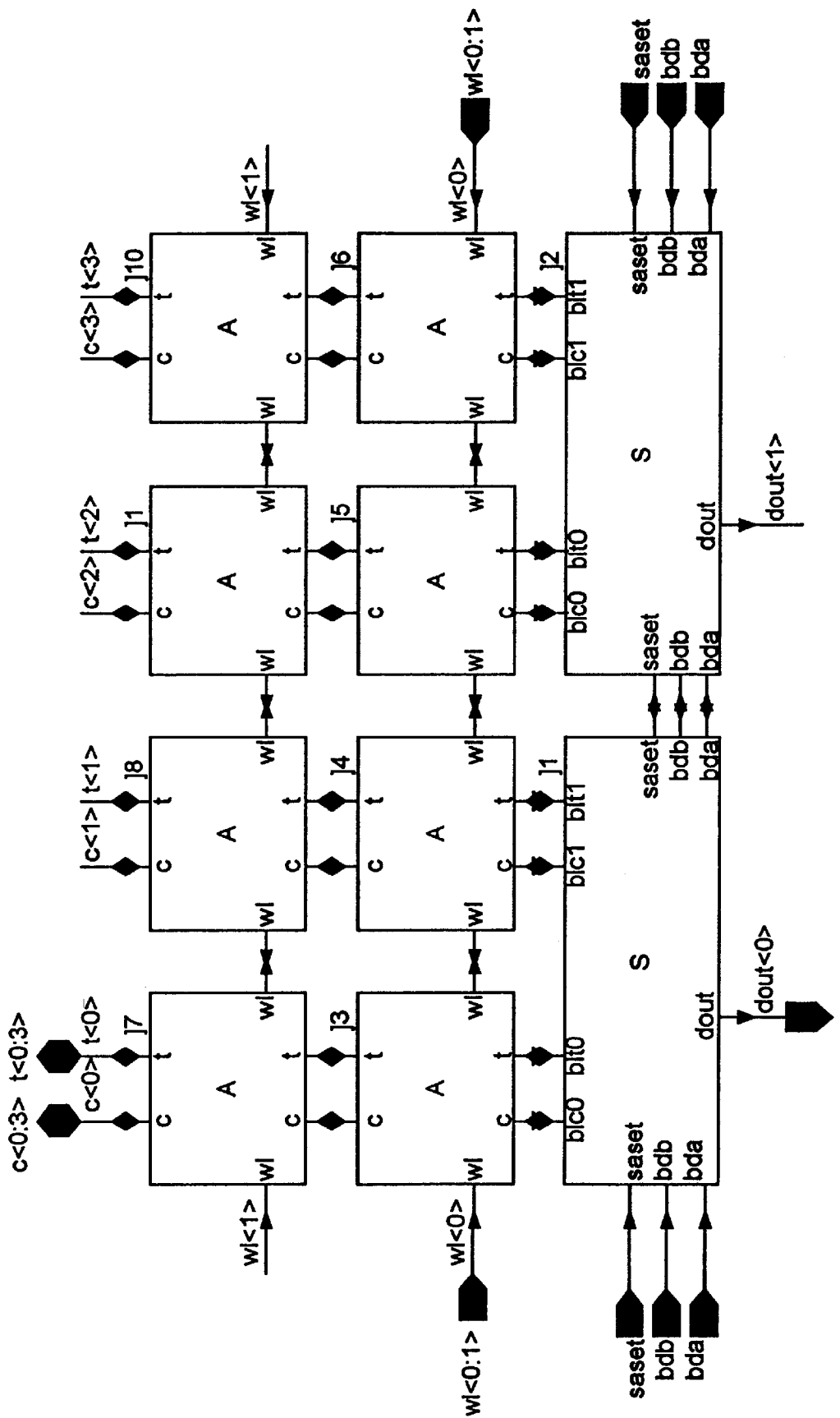
Figure 14:
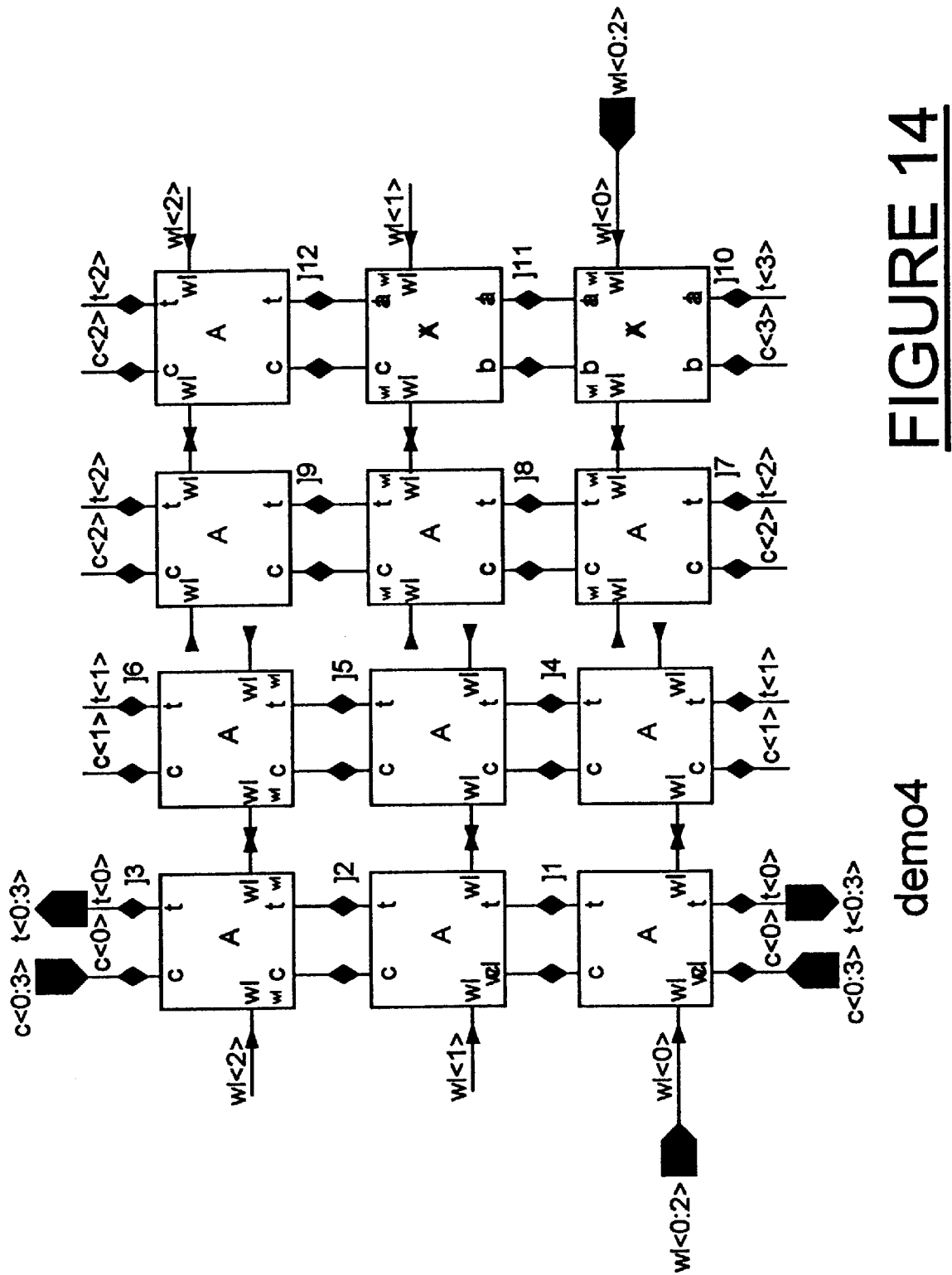
Figure 15:
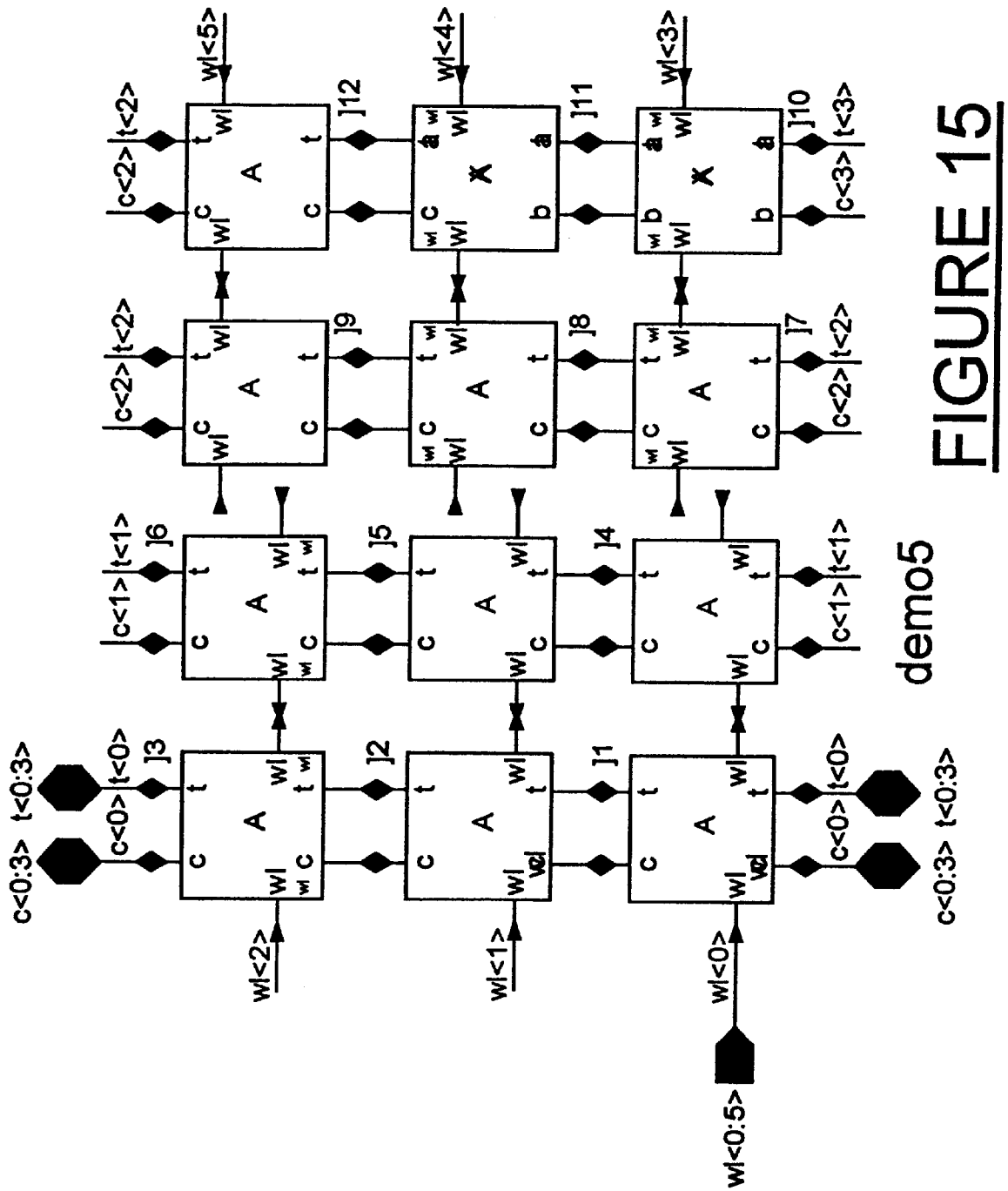
Figure 16:
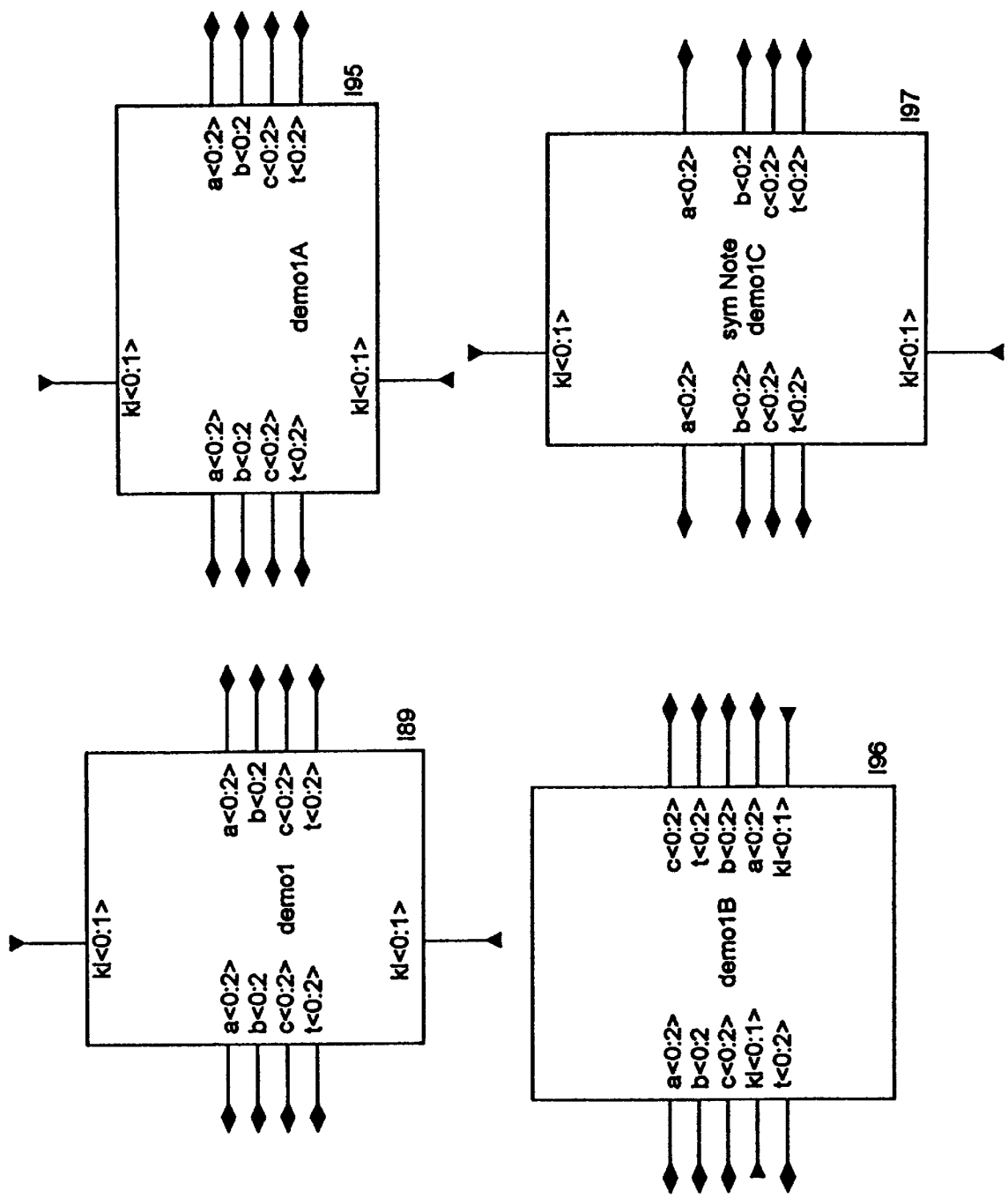

; third level (Note the corresponding third level illustrations, level_3a and level_3b of FIGS. 5A and 5B, where multiple instances of a leaf cell, "leaf_A" are placed.)
buildArray(lN "level_3a" vt "b" list(4 1 "leaf_A" "YD")
?pm list("c" "bc0" "t" "bt0"))
buildArray(lN "level_3b" vt "b" list(4 1 "leaf_A" "YD")
?pm list("c" "bcl" "t" "btl"))
; second levels (Note the corresponding second level illustrations, level_2a, level_2b and level_2c of FIGS. 6A, 6B and 6C.)
buildArray(lN "level_2a" vt "1" list(1 1 "leaf_C" 4 1 "leaf_B" "YD")
?bx −3 ?fps list("clk" "tb" 9 "dwl" "r" 4))
buildArray(lN "level_2B" vt "1"
list(qwl 1 "level_3a" qWl 1 "level_3b" "MY")
?fps list("bc0" "tb" −2 "wl" "lr" 3 "btl" "tb"7)
?nps "tb" ?bx −3)
buildArray(lN "level_2c" vt "1" list(wls 1 "leaf_E" "YD"))
; first levels (Note the corresponding first level illustrations, level_1a, level_1b and level_1c of FIGS. 7A, 7B and 7C.)
buildArray(lN "level_1a" vt "r"
list(1 1 "leaf_J" 1 1 "leaf_G" −1 qWl 1 "level_2a"−1 1 1 "leaf_H" −1 1 2 "leaf_G") ?pm list("dwl" "wl"))
buildArray(lN "level_lb" vt "b"
list(1 1 "leaf_S" 1 1 "level_2b" 1 1 "leaf_D" 1 1"leaf_F")
?sp list("data") ?apt list("data"))
buildArray(lN "level_1c" vt "b" list(1 1 "leaf_G" 1 1"level_2c"
2 1 "leaf_G"))
; top (zero) level (Note the corresponding first level illustrations, schematic level_0 in FIG. 8A and physical level_0 in FIG. 8B.)
buildArray(lN "level_0" vt "1"
list(1 1 "level_1a" 1 bts "level_1b" 1 1 "level_1c"))
; placer reset demo and pin mapping (Note the corresponding demol of FIG. 9; demo2 of FIG. 10; demo3 at C in FIGS. 3A & 3E of FIG. 11; demo3 at I in FIGS. 3F & 3G of FIG. 12; demo3 of FIG. 13; demo4 of FIG. 14; and demo5 of FIG. 15.)
demol shows the pin mapping directive. Note how on the right side of the schematic the pin "kl" coming out of leaf_X is renamed or mapped to the name "wl".
buildArray(lN "demol" vt "1" list(2 3 "leaf_A" 2 3 "leaf_X") ?pm list("kl" "wl"))
demo2 shows the effects of a placer reset command. After the matrix of leaf_A's is finished placing, the placer pointer is reset back to the left side of the schematic. So in comparison to demol the matrix of leaf_X cells get placed above the matrix of leaf_A cells as opposed to the right of them. Note also the pin mappings on the bottom of pins "c" to "b" and "t" to "a".
buildArray(lN "demo2" vt "1" list(2 3 "leaf_A" −1 2 3 "leaf_X")
?pm list("c" "b" "t" "a"))
FIG. 11 shows the building of demo3 and corresponds to the state of the schematic at point C in FIGS. 3A and 3E. FIG. 12 shows the building of demo3 and corresponds to the state of the schematic at point I in FIGS. 3F and 3G. FIG. 13 shows the finished demo3 schematic.
buildArray(lN "demo3" vt "b" list(1 2 "leaf_S" 2 3 "leaf_A"))
; adjusting pin type (Note demo4 in FIG. 14.)
Note how pins "c" and "t" on leaf_A are bi-directional but have been changed to input and output respectively in schematic demo4. (FIG. 14)
buildArray(lN "demo4" vt "1" list(3 2 "leaf_A" 3 2"leaf_A" "MX")
?in list("c") ?out list("t"))
; showing non-equated bus on multiple sides (bus "wl") (Note demo5 in FIG. 15.)
Notice on the right side how pin "wl" is label wl<3>, wl<4>, wl<5> instead of wl<0>, wl<1>, wl<2> as it would be normally.
buildArray(lN "demo5" vt "1" list(3 2 "leaf_A" 3 2"leaf_A" "MX"
?sb list("wl"))
; change symbol size (schematic is same as demo1) Note FIG. 16.
buildArray(lN "demo1A" vt "1" list(2 3 "leaf_A" 2 3"leaf_X")
?pm list("wl" "kl") ?bx −2 ?by 3)
; do different sort on top side, move "kl" pin to top and bottom sides
buildArray(lN "demo1B" vt "1" list(2 3 "leaf_A" 2 3"leaf_X")
?pm list("wl" "kl") ?nps "t" ?fps list("k" "tb"))
; put space between pins "a" "b" and add note to symbol
buildArray(lN "demo1C" vt "1" list(2 3 "leaf_A" 2 3"leaf_X")
?pm list("wl" "kl") ?fps list("b" "tb" 2)
?note list("sym Note"))
; finish up
printf(">> Generator done creating % ss for % s\n" vt aName)
)
)

Referring now to FIG. 17, an article of manufacture or a computer program product 1700 of the invention is illustrated. The computer program product 1700 includes a recording medium 1702, such as, a floppy disk, a high capacity read only memory in the form of an optically read compact disk or CD-ROM, a tape, a transmission type media such as a digital or analog communications link, or a similar computer program product. Recording medium 1702 stores program means 1704, 1706, 1708, 1710 on the medium 1702 for carrying out the methods for assembling array and datapath macros of the preferred embodiment in the system 100 of FIG. 1.

A sequence of program instructions or a logical assembly of one or more interrelated modules defined by the recorded program means 1704, 1706, 1708, 1710, direct the computer system 100 for assembling array and datapath macros of the preferred embodiment.

While the present invention has been described with reference to the details of the embodiments of the invention shown in the drawing, these details are not intended to limit the scope of the invention as claimed in the appended claims.

What is claimed is:

1. A computer implemented method for assembling array and datapath macros for very large scale integrated (VLSI) semiconductor integrated circuits comprising the steps of:
   (a) receiving initial user selections for a hierarchical macro to be created; said initial user selections including a command list of multiple leaf cell build commands; responsive to said received initial user selections, automatically performing the steps of:
   (b) initializing X and Y placer pointers;
   (c) obtaining a next build command from the command list and identifying a command type;
   (d) identifying a next leaf cell build command in a leaf cell group;
   (e) identifying a user selected schematic or physical view, and reading a corresponding leaf cell view for the user selected schematic or physical view; said leaf cell view represented by a symbol;
   (f) obtaining X and Y sizes for the leaf cell view;
   (g) orienting and placing the leaf cell; including the steps of providing connections to adjacent leaf cells by abutting leaf cells together;
   (h) calculating next X and Y placer pointers; and
   (i) repeating steps (d)–(h) until a last leaf cell build command in the leaf cell group is found;
   (j) returning to step (c) for obtaining a next build command from the command list and identifying a command type;
   (k) for the user selected schematic view, obtaining each unconnected pin from all symbols along the perimeter of the placed leaf cells, and connecting said obtained pins to schematic pins of same name and type;
   (l) condensing said schematic pins by removing bussing from single bit busses and combining bussed single pins into multiple bit bus pins; and
   (m) creating a symbol view; and (n) moving said combined bus pins to different sides and adjusting pin spacing of said moved pins responsive to received user selections.

2. A computer implemented method for assembling array and datapath macros as recited in claim 1 further comprising the steps of adding global power and ground busing responsive to identified user selections for a user selected physical view.

3. A computer implemented method for assembling array and datapath macros as recited in claim 2 further comprising the step of numbering of bits in bussed pins and adjusting pin types for a user selected physical view responsive to identified user selections.

4. A computer implemented method for assembling array and datapath macros as recited in claim 2 further comprising the steps of numbering of bits in bussed pins and adjusting pin types for a user selected schematic view responsive to identified user selections.

5. A computer implemented method for assembling array and datapath macros as recited in claim 2 further comprising the step of adding text to pins for said user selected physical view.

6. A computer implemented method for assembling array and datapath macros as recited in claim 2 further comprising the step of adding a boundary box on a level GROWBOX for said user selected physical view.

7. A computer implemented method for assembling array and datapath macros as recited in claim 6 further comprising the step of modifying a size of said boundary box for said user selected physical view.

8. A computer implemented method for assembling array and datapath macros as recited in claim 2 further comprising the step of for the user selected physical view, moving said schematic pin locations to a predefined grid.

9. A computer implemented method for assembling array and datapath macros as recited in claim 1 further comprising the steps of (o) creating a bounding box for the created symbol and adjusting size of the bounding box responsive to received users selections.

10. A computer implemented method for assembling array and datapath macros as recited in claim 1 further comprising the step (p) adding one of an instance label, a cell name label or a library name label.

11. A computer implemented method for assembling array and datapath macros as recited in claim 1 further comprising the step of propagating connections from a periphery of an array of placed leaf cells to a next hierarchical level.

12. A computer implemented method for assembling array and datapath macros as recited in claim 1 further comprising the step of pin mapping for renaming pins and for changing types of pins.

13. A computer implemented method for assembling array and datapath macros as recited in claim 1 further comprising the steps of identifying user selection for override of listed pins, and making said listed pins global.

14. A computer implemented method for assembling array and datapath macros as recited in claim 1 further comprising the step of adding notes to a created symbol view.

15. A computer implemented method for assembling array and datapath macros as recited in claim 14 further comprising the step of sorting pins on said symbol view by location in the schematic view or alphanumerically.

16. A computer implemented method for assembling array and datapath macros as recited in claim 1 further comprising the step of identifying a user selection for separate bus of listed pins, said listed pins being bussed and not being shorted.

17. A computer implemented method for assembling array and datapath macros as recited in claim 1 further comprising the step of identifying user selected directives to override default values.

18. Apparatus for assembling array and datapath macros for very large scale integrated (VLSI) semiconductor integrated circuits comprising:
    means for receiving initial user selections for a hierarchical macro to be created; said initial user selections including a command list of multiple leaf cell build commands; means, responsive to said initial user selections receiving means, for automatically assembling array and datapath macros including:
    means for initializing X and Y placer pointers;
    means for obtaining a next build command from the command list and identifying a command type;
    means, responsive to identifying a next leaf cell build command in a leaf cell group, for identifying a user selected schematic or physical view, and for reading a corresponding leaf cell view for the user selected schematic or physical view; said leaf cell view represented by a symbol;
    means, responsive to said read leaf cell view, for obtaining X and Y sizes for said leaf cell view;
    means, responsive to said obtained X and Y sizes, for orienting and for placing said leaf cell, and for providing connections to adjacent leaf cells by abutting leaf cells together;
    means, responsive to said placed leaf cell, for calculating next X and Y placer pointers;
    means for sequentially processing said leaf cells until a last leaf cell build command in the leaf cell group is found; and
    means, responsive to said last leaf cell build command for obtaining the next build command from the command list and for identifying the command type;
    for the user selected schematic view, means for obtaining each unconnected pin from all symbols along the perimeter of the placed leaf cells, and for connecting said obtained pins to schematic pins of same name and type;
    means for condensing said schematic pins by removing bussing from single bit busses and combining bussed single pins into multiple bit bus pins; and
    means for creating a symbol view; and for moving said combined bus pins to different sides and for adjusting pin spacing of said moved pins responsive to received user selections.

19. A computer program product for assembling array and datapath macros for very large scale integrated (VLSI) semiconductor integrated circuits, said computer program product including a plurality of computer executable instructions stored on a computer readable medium, wherein said instructions, when executed by said computer, cause the computer to perform the steps of:
    (a) receiving initial user selections for a hierarchical macro to be created; said initial user selections including a command list of multiple leaf cell build commands; responsive to said received initial user selections, automatically performing the steps of:
    (b) initializing X and Y placer pointers;
    (c) obtaining a next build command from the command list and identifying a command type;
    (d) identifying a next leaf cell build command in a leaf cell group;
    (e) identifying a user selected schematic or physical view, and reading a corresponding leaf cell view for the user selected schematic or physical view; said leaf cell view represented by a symbol;
    (f) obtaining X and Y sizes for the leaf cell view;
    (g) orienting and placing the leaf cell and providing connections to adjacent leaf cells by abutting leaf cells together;
    (h) calculating next X and Y placer pointers; and
    (i) repeating steps (d)–(h) until a last leaf cell build command in the leaf cell group is found;
    (j) returning to step (c) for obtaining a next build command from the command list and identifying a command type;
    (k) for the user selected schematic view, obtaining each unconnected pin from all symbols along the perimeter of the placed leaf cells, and connecting said obtained pins to schematic pins of same name and type;
    (l) condensing said schematic pins by removing bussing from single bit busses and combining bussed single pins into multiple bit bus pins; and
    (m) creating a symbol view; and (n) moving said combined pins to different sides and adjusting pin spacing of said moved pins responsive to received user selections.

20. A computer program product for assembling array and datapath macros for very large scale integrated (VLSI) semiconductor integrated circuits as recited in claim 19 wherein said instructions, when executed by said computer, further cause the computer to perform the steps of propagating connections from a periphery of an array of placed leaf cells to a next hierarchical level.

21. A computer program product for assembling array and datapath macros for very large scale integrated (VLSI) semiconductor integrated circuits as recited in claim 19 wherein said instructions, when executed by said computer, further cause the computer to perform the steps of identifying user selected directives to override default values.

* * * * *